US012575205B2

(12) United States Patent
Kim et al.

(10) Patent No.: US 12,575,205 B2
(45) Date of Patent: Mar. 10, 2026

(54) IMAGE SENSOR

(71) Applicant: SAMSUNG ELECTRONICS CO., LTD., Suwon-si (KR)

(72) Inventors: Doojin Kim, Suwon-si (KR); Junetaeg Lee, Yongin-si (KR); Sungkwan Kim, Hwaseong-si (KR); Seokha Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 713 days.

(21) Appl. No.: 17/719,836

(22) Filed: Apr. 13, 2022

(65) Prior Publication Data

US 2022/0359596 A1 Nov. 10, 2022

(30) Foreign Application Priority Data

May 7, 2021 (KR) ........................ 10-2021-0059574

(51) Int. Cl.
H10F 39/00 (2025.01)

(52) U.S. Cl.
CPC ..... H10F 39/8063 (2025.01); H10F 39/8053 (2025.01); H10F 39/8057 (2025.01); H10F 39/811 (2025.01)

(58) Field of Classification Search
CPC ... H10F 39/8063; H10F 39/024; H10F 39/806
See application file for complete search history.

(56) References Cited

U.S. PATENT DOCUMENTS

| | | | |
|---|---|---|---|
| 7,084,472 B2 | 8/2006 | Fukuyoshi et al. | |
| 8,102,448 B2 * | 1/2012 | Kim ..................... | H10F 39/8063 |
| | | | 257/233 |
| 8,492,864 B2 | 7/2013 | Watanabe | |
| 8,952,309 B2 * | 2/2015 | Chen ................. | H01L 27/14685 |
| | | | 250/208.1 |
| 9,087,761 B2 * | 7/2015 | Otsuka ................ | H10F 39/8057 |
| 9,159,760 B2 * | 10/2015 | Ootsuka ............ | H01L 27/14621 |
| 10,008,529 B2 * | 6/2018 | Nakashikiryo ..... | H10F 39/8057 |
| 10,088,608 B2 * | 10/2018 | Ootsuka .................. | G02B 1/113 |
| 10,276,615 B2 * | 4/2019 | Shibuta ............... | H10F 39/8063 |
| 10,461,107 B2 * | 10/2019 | Ootsuka .................. | G02B 5/201 |
| 10,665,637 B2 | 5/2020 | Park et al. | |
| 10,847,561 B2 * | 11/2020 | Itabasi .............. | H01L 27/14621 |

(Continued)

FOREIGN PATENT DOCUMENTS

| | | | |
|---|---|---|---|
| JP | 2002-33466 A | 1/2002 | |
| JP | 2003-258224 A | 9/2003 | |

(Continued)

*Primary Examiner* — Mounir S Amer
*Assistant Examiner* — Alexander Belouson
(74) *Attorney, Agent, or Firm* — Sughrue Mion, PLLC

(57) ABSTRACT

An image sensor is provided. The image sensor includes: a substrate including a pixel array zone; a microlens layer on the substrate in the pixel array zone; a first passivation layer on the microlens layer; and a second passivation layer on the first passivation layer, wherein the microlens layer includes: a first lens pattern; a second lens pattern at a side of the first lens pattern; and a first point where the first lens pattern meets the second lens pattern, and at least one of the first passivation layer and the second passivation layer is on the first lens pattern, the second lens pattern, and the first point.

17 Claims, 24 Drawing Sheets

AA

(56) References Cited

U.S. PATENT DOCUMENTS

| | | | | |
|---|---|---|---|---|
| 11,323,608 B2 * | 5/2022 | Pang | .................... | H10F 39/807 |
| 11,355,541 B2 | 6/2022 | Lee et al. | | |
| 11,411,031 B2 * | 8/2022 | Ootsuka | ............. | H10F 39/8063 |
| 11,646,339 B2 * | 5/2023 | Ootsuka | ............. | H02K 15/0433 |
| | | | | 348/340 |
| 11,760,046 B2 * | 9/2023 | Jang | ................. | H01L 27/14627 |
| | | | | 359/797 |
| 11,791,357 B2 * | 10/2023 | Wu | .................. | H01L 27/14689 |
| | | | | 257/446 |
| 11,961,861 B2 * | 4/2024 | Ootsuka | ............. | G02B 3/0062 |
| 12,199,118 B2 * | 1/2025 | Lee | ........................ | A23B 99/00 |
| 2001/0051405 A1 * | 12/2001 | Sekine | ............... | H10F 39/8053 |
| | | | | 438/208 |
| 2006/0023313 A1 * | 2/2006 | Kim | ................. | H01L 27/14685 |
| | | | | 359/620 |
| 2007/0172974 A1 | 7/2007 | Kim | | |
| 2012/0086093 A1 * | 4/2012 | Otsuka | ................. | H10F 39/024 |
| | | | | 257/E31.127 |
| 2013/0082163 A1 * | 4/2013 | Chen | .................. | H10F 39/8063 |
| | | | | 29/458 |
| 2015/0123227 A1 * | 5/2015 | Ootsuka | ................. | G02B 5/201 |
| | | | | 257/432 |
| 2016/0056188 A1 * | 2/2016 | Lee | ......................... | H10F 39/18 |
| | | | | 257/446 |
| 2016/0204144 A1 * | 7/2016 | Lee | ...................... | H10F 39/026 |
| | | | | 257/432 |
| 2016/0231468 A1 * | 8/2016 | Ootsuka | ............... | H10F 39/805 |
| 2017/0040374 A1 * | 2/2017 | Oh | ...................... | H01L 25/0657 |
| 2017/0084655 A1 * | 3/2017 | Shibuta | ............... | H04N 25/134 |

| | | | | |
|---|---|---|---|---|
| 2017/0278889 A1 * | 9/2017 | Nakashikiryo | ..... | H10F 39/8057 |
| 2019/0052823 A1 * | 2/2019 | Jung | ................. | H01L 27/14623 |
| 2019/0229220 A1 * | 7/2019 | Tazoe | .................. | H01L 27/1462 |
| 2020/0045223 A1 * | 2/2020 | Pang | .................. | H10F 39/8023 |
| 2020/0066776 A1 * | 2/2020 | Ootsuka | ............. | H10F 39/8053 |
| 2020/0185443 A1 * | 6/2020 | Itabasi | .................. | G02B 1/113 |
| 2020/0227455 A1 * | 7/2020 | Lee | ......................... | H10F 19/75 |
| 2021/0202546 A1 * | 7/2021 | Liu | .................. | H01L 27/14685 |
| 2021/0202559 A1 * | 7/2021 | Jang | ................. | H01L 27/14627 |
| 2021/0366956 A1 * | 11/2021 | Wu | .................. | H01L 27/14621 |
| 2022/0278156 A1 * | 9/2022 | Ootsuka | ............. | H10F 39/8053 |
| 2022/0359596 A1 * | 11/2022 | Kim | .................. | H10F 39/8063 |
| 2023/0057857 A1 * | 2/2023 | Lim | .................. | H10F 39/8063 |
| 2023/0197740 A1 * | 6/2023 | Lee | ....................... | H10F 39/802 |
| | | | | 257/432 |
| 2023/0238415 A1 * | 7/2023 | Ootsuka | ............. | H02K 15/0433 |
| | | | | 348/340 |
| 2023/0402476 A1 * | 12/2023 | Seo | ................... | H01L 27/14685 |
| 2024/0120359 A1 * | 4/2024 | Moriya | ................ | H10F 39/805 |
| 2024/0243150 A1 * | 7/2024 | Seo | .................. | H01L 27/14685 |
| 2024/0282792 A1 * | 8/2024 | Seo | .................. | H01L 27/14621 |
| 2024/0282796 A1 * | 8/2024 | Park | ..................... | H10F 39/014 |
| 2024/0387590 A1 * | 11/2024 | Kim | ..................... | H10F 39/014 |

FOREIGN PATENT DOCUMENTS

| | | |
|---|---|---|
| JP | 2006-86356 A | 3/2006 |
| JP | 2008-258203 A | 10/2008 |
| JP | 2016-1682 A | 1/2016 |
| KI | 10-2019-0115314 A | 10/2019 |
| KR | 10-2012-0037876 A | 4/2012 |
| KR | 10-2020-0087909 A | 7/2020 |

* cited by examiner

<u>B</u>

OB

<u>C</u>

PAD

<u>B</u>

OB

<u>C</u>

PAD

<u>B</u>

OB

<u>C</u>

PAD

FIG. 7B

IMAGE SENSOR

CROSS-REFERENCE TO RELATED APPLICATION

This application claims priority from Korean Patent Application No. 10-2021-0059574 filed on May 7, 2021 in the Korean Intellectual Property Office, the disclosure of which is incorporated herein in its entirety by reference.

BACKGROUND

The disclosure relates to an image sensor, and more particularly, to a passivation layer of an image sensor.

An image sensor is a device for converting optical images into electrical signals. An image sensor may include a charge coupled device (CCD) type and a complementary metal oxide semiconductor (CMOS) type. The CMOS image sensor (abbreviated as "CIS") has a plurality of pixels arranged two-dimensionally (2D). Each of the pixels includes a photodiode. The photodiode serves to convert incident light into electrical signals.

SUMMARY

Various embodiments of the disclosure are directed to preventing damage to an image sensor.

These embodiments may improve optical properties of an image sensor.

The disclosure is not limited to the embodiments provided herein, and additional aspects, features and advantages of the disclosure will be apparent from the following description.

According to embodiments, an image sensor may include: a substrate including a pixel array zone; a microlens layer on the substrate in the pixel array zone; a first passivation layer on the microlens layer; and a second passivation layer on the first passivation layer, wherein the microlens layer includes: a first lens pattern; a second lens pattern at a side of the first lens pattern; and a first point where the first lens pattern meets the second lens pattern, and at least one of the first passivation layer and the second passivation layer is on the first lens pattern, the second lens pattern, and the first point.

According to embodiments, an image sensor may comprise: a substrate that includes a plurality of pixel sections; a plurality of photoelectric conversion regions in corresponding pixel sections of the substrate; a microlens layer on a first surface of the substrate and vertically overlapping the photoelectric conversion regions; a first passivation layer on the microlens layer; and a second passivation layer on the first passivation layer.

According to embodiments, an image sensor may include: a substrate having a pixel array zone; a plurality of photoelectric conversion regions in the pixel array zone; a plurality of separation patterns between the photoelectric conversion regions in the substrate; a dielectric layer on a first surface of the substrate; a plurality of color filters on the dielectric layer in the pixel array zone; a fence pattern between the color filters; a microlens layer on the color filters; a gate pattern on a second surface of the substrate in the pixel array zone; a wiring layer on the second surface of the substrate in the pixel array zone; a first passivation layer on the microlens layer in the pixel array zone; and a second passivation layer on the first passivation layer.

BRIEF DESCRIPTION OF THE DRAWINGS

FIG. 7B illustrates a cross-sectional view taken along a line V-V' of FIG. 7A.

DETAILED DESCRIPTION

Figure 1:
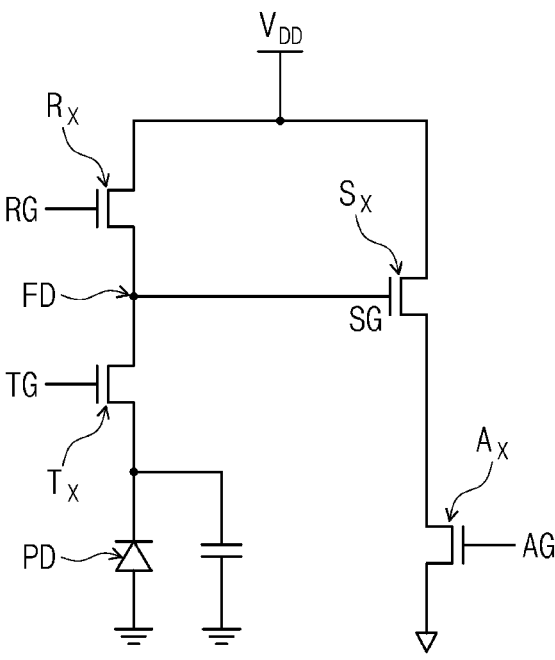
FIG. 1 illustrates a circuit diagram showing a pixel of an image sensor according to embodiments.

It will be understood that when an element or layer is referred to as being "over," "above," "on," "below," "under," "beneath," "connected to" or "coupled to" another element or layer, it can be directly over, above, on, below, under, beneath, connected or coupled to the other element or layer or intervening elements or layers may be present. In contrast, when an element is referred to as being "directly over," "directly above," "directly on," "directly below," "directly under," "directly beneath," "directly connected to" or "directly coupled to" another element or layer, there are no intervening elements or layers present. Spatially relative terms, such as "over," "above," "on," "upper," "below," "under," "beneath," "lower," and the like, may be used herein for ease of description to describe one element's or feature's relationship to another element(s) or feature(s) as illustrated in the figures. It will be understood that the spatially relative terms are intended to encompass different orientations of a device in use or operation in addition to the orientation depicted in the figures. For example, if the device in a figure is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein interpreted accordingly.

As used herein, expressions such as "at least one of," when preceding a list of elements, modify the entire list of elements and do not modify the individual elements of the list. For example, the expression, "at least one of a, b, and c," should be understood as including only a, only b, only c, both a and b, both a and c, both b and c, or all of a, b, and c. In the following description, like reference numerals may indicate like components.

The following will now describe an image sensor according to embodiments.

FIG. 1 illustrates a circuit diagram showing a pixel of an image sensor according to embodiments.

Referring to FIG. 1, each pixel of an image sensor may include a photoelectric conversion region PD, a transfer transistor Tx, a source follower transistor Sx, a reset transistor Rx, and a selection transistor Ax. The transfer transistor Tx, the source follower transistor Sx, the reset transistor Rx, and the selection transistor Ax may respectively include a transfer gate TG, a source follower gate SG, a reset gate RG, and a selection gate AG.

The photoelectric conversion region PD may be a photodiode that includes an n-type impurity region and a p-type impurity region. A floating diffusion region FD may serve as a drain of the transfer transistor Tx. The floating diffusion region FD may also serve as a source of the reset transistor Rx. The floating diffusion region FD may be electrically connected to the source follower gate SG of the source follower transistor Sx. The source follower transistor Sx may be connected to the selection transistor Ax.

An operation of the image sensor will be explained below with reference to FIG. 1. First, a power voltage $V_{DD}$ may be applied to a drain of the reset transistor Rx and a drain of the source follower transistor Sx under a light-blocked state, so that the reset transistor Rx may be turned on to discharge charges that remain on the floating diffusion region FD. Thereafter, when the reset transistor Rx is turned off and external light is incident on the photoelectric conversion region PD, electron-hole pairs may be generated from the photoelectric conversion region PD. Holes may be transferred to and accumulated on a p-type impurity region of the photoelectric conversion region PD, and electrons may be transferred to and accumulated on an n-type impurity region of the photoelectric conversion region PD. When the transfer transistor Tx is turned on, charges such as electrons and holes may be transferred to and accumulated on the floating diffusion region FD. A gate bias of the source follower transistor Sx may change in proportion to an amount of the accumulated charges, and this may bring about a variation in source potential of the source follower transistor Sx. In this case, when the selection transistor Ax is turned on, charges may be read out as signals transmitted through a column line.

A wiring line may be electrically connected to one or more of the transfer gate TG, the source follower gate SG, the reset gate RG, and the selection gate AG. The wiring line may be configured to apply the power voltage $V_{DD}$ to the drain of the reset transistor Rx or the drain of the source follower transistor Sx. The wiring line may include a column line connected to the selection transistor Ax. The wiring line may be a first conductive structure 830 which will be discussed below with respect to FIG. 2B.

FIG. 1 shows, by way of example, a pixel that includes one photoelectric conversion region PD and four transistors Tx, Rx, Ax, and Sx, but the disclosure is not limited thereto. For example, the pixel shown in FIG. 1 may be provided in plural, and neighboring pixels may share one of the reset transistor Rx, the source follower transistor Sx, and the selection transistor Ax. Therefore, the image sensor may increase in integration.

Figure 2A:
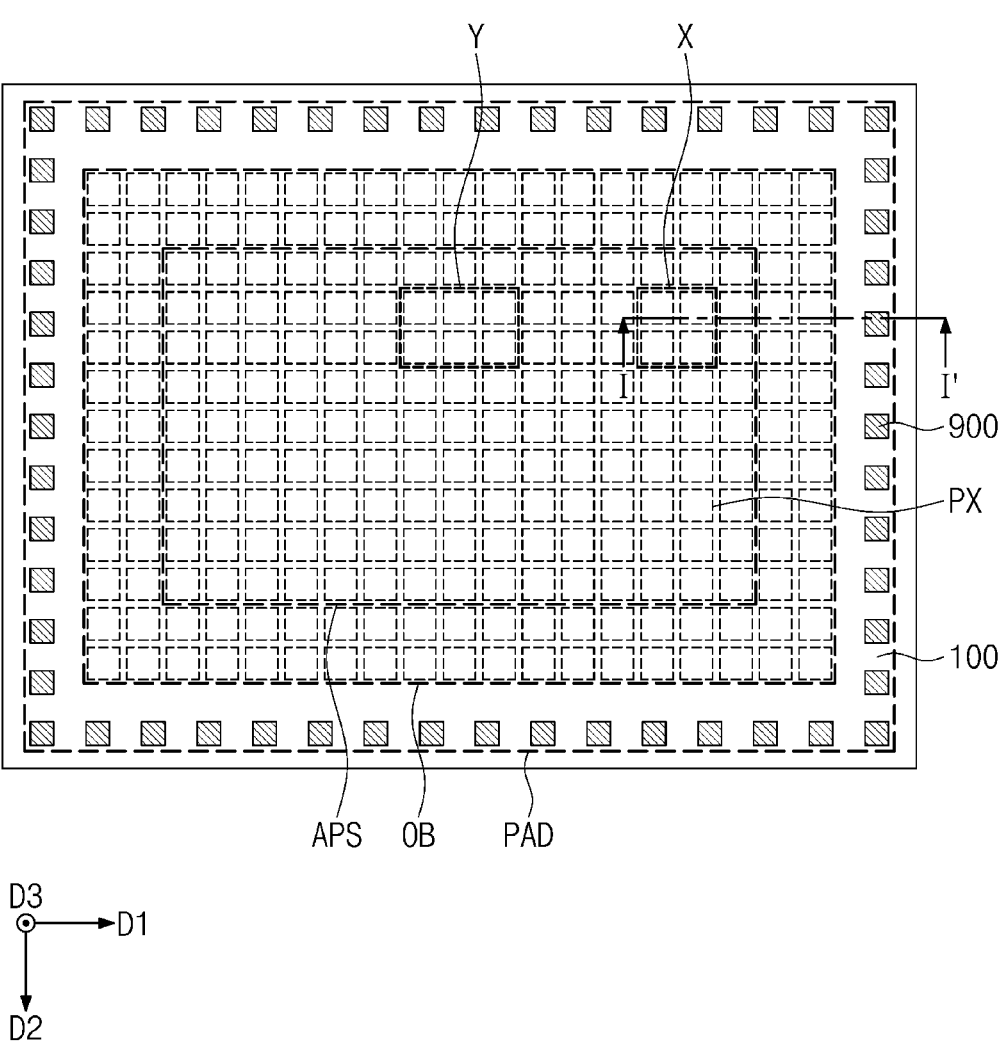
FIG. 2A illustrates a plan view of an image sensor according to embodiments.
Figure 2B:
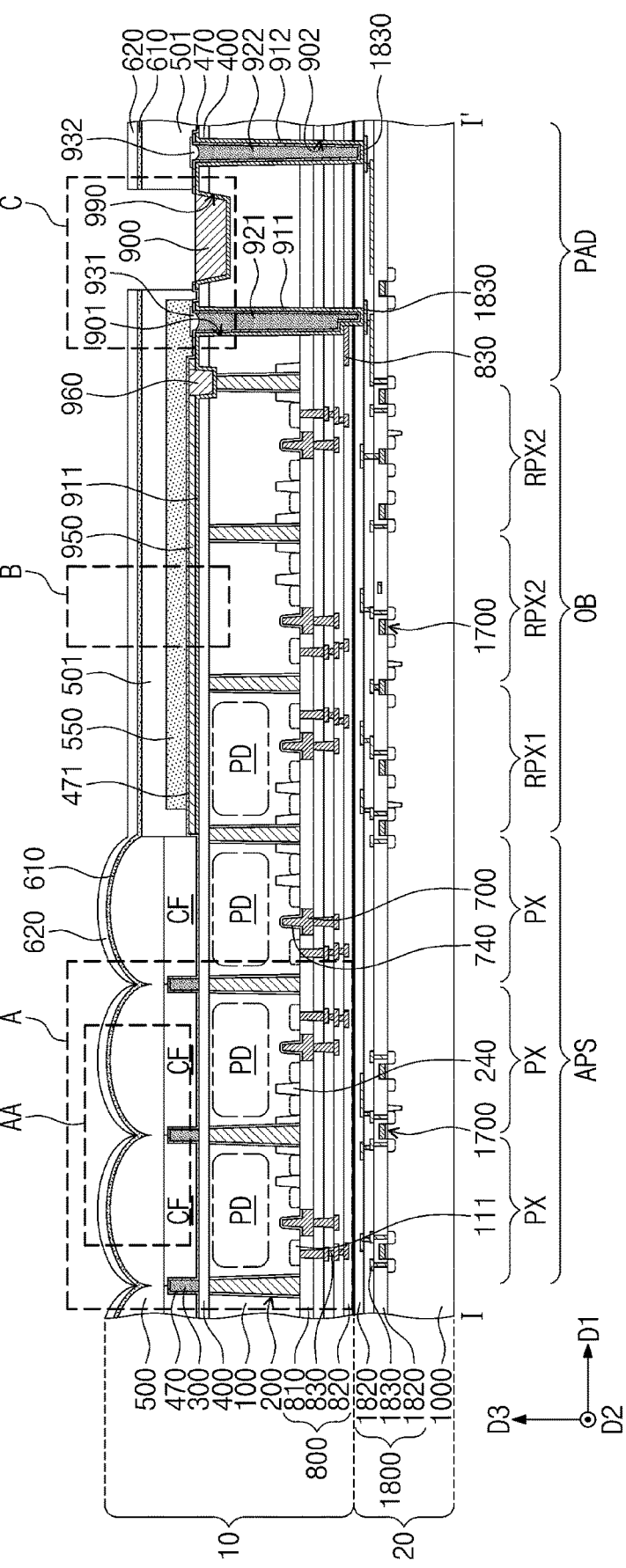
FIG. 2B illustrates a cross-sectional view taken along a line I-I' of FIG. 2A.
Figure 2C:
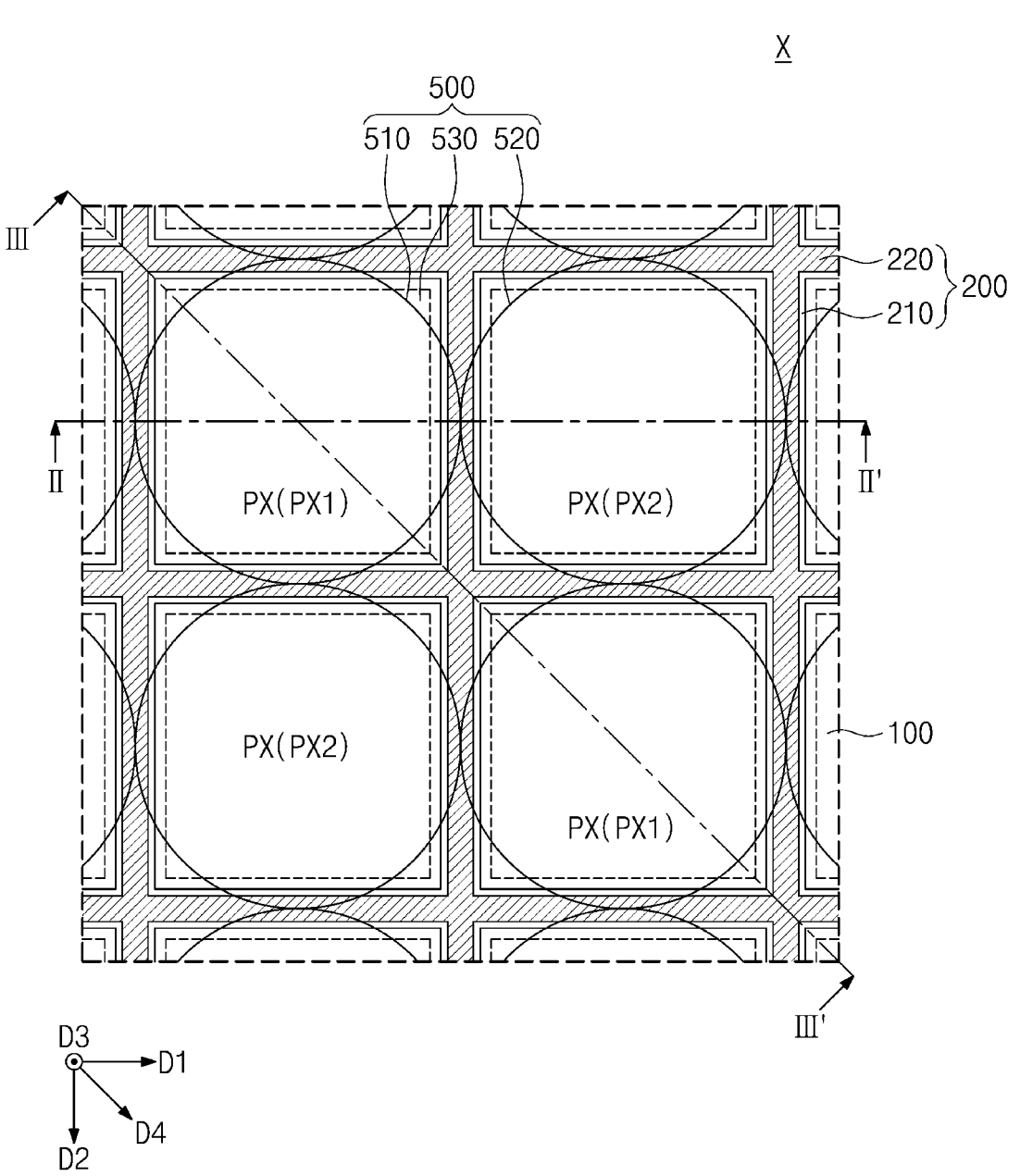
FIG. 2C illustrates an enlarged view showing section X of FIG. 2A.
Figure 2D:
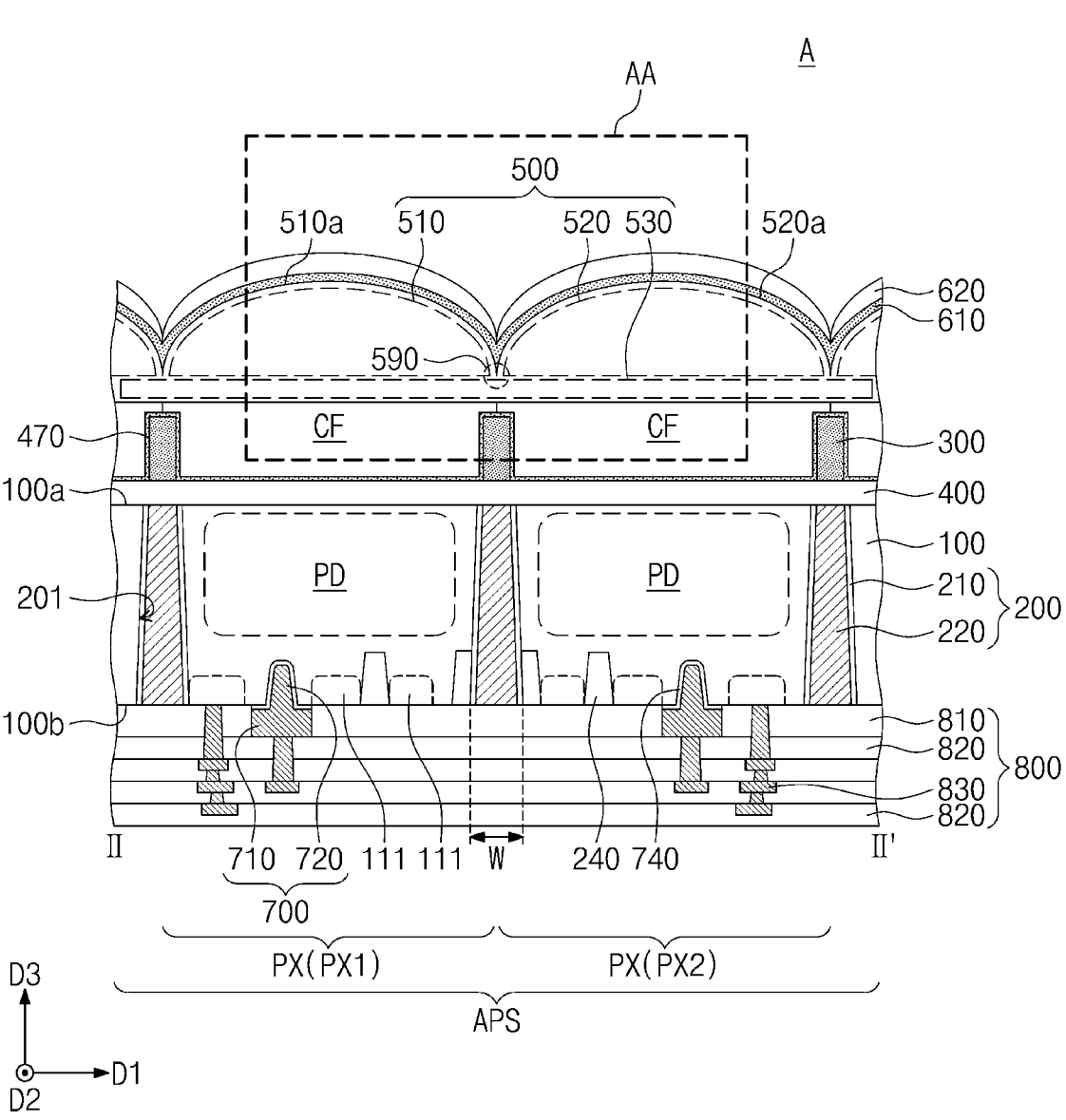
FIG. 2D illustrates a cross-sectional view taken along a line II-II' of FIG. 2C.
Figure 2E:
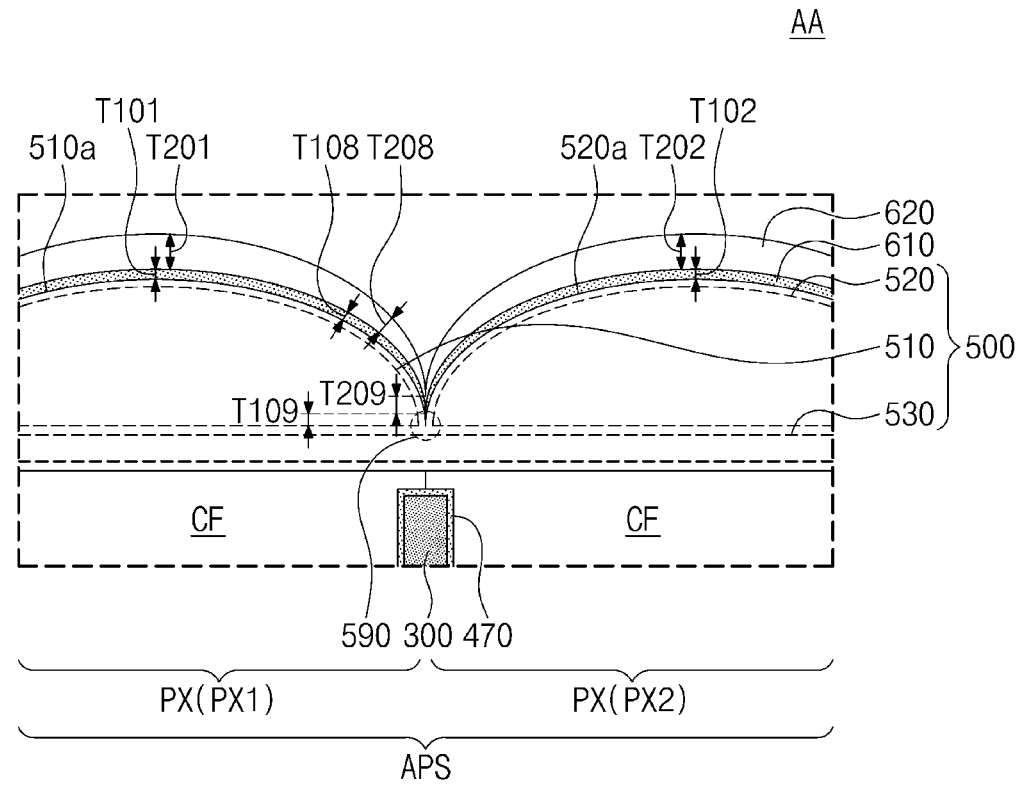
FIG. 2E illustrates an enlarged view showing section AA of FIG. 2D.
Figure 2F:
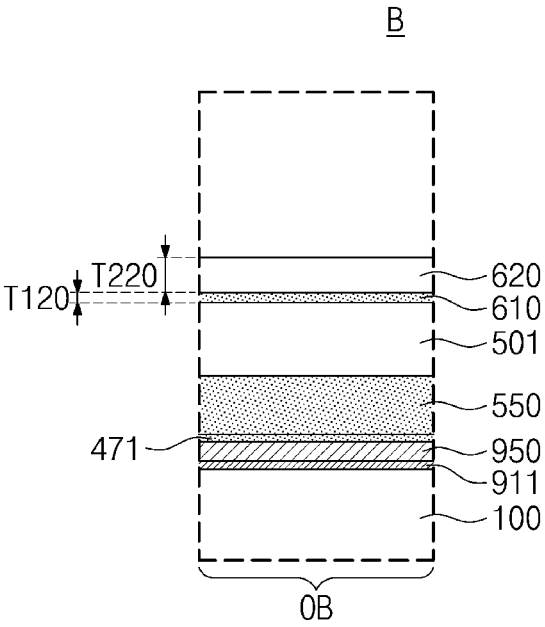
FIG. 2F illustrates an enlarged view showing section B of FIG. 2B.
Figure 2G:
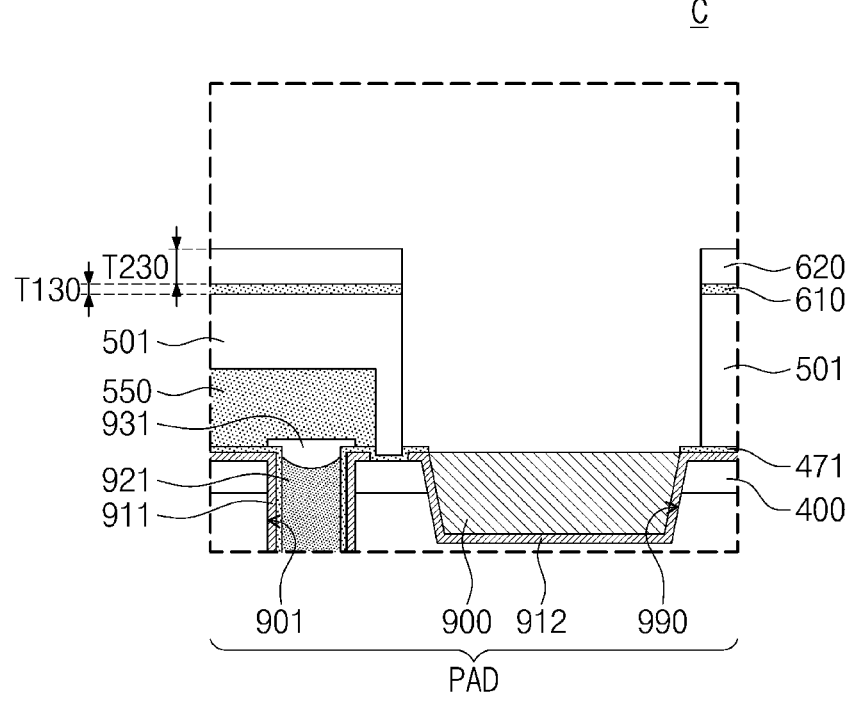
FIG. 2G illustrates an enlarged view showing section C of FIG. 2B.

FIG. 2A illustrates a plan view showing an image sensor according to embodiments. FIG. 2B illustrates a cross-sectional view taken along a line I-I' of FIG. 2A. FIG. 2C illustrates an enlarged view showing section X of FIG. 2A. FIG. 2D illustrates a cross-sectional view taken along a line II-II' of FIG. 2C and an enlarged view showing section A of FIG. 2B. FIG. 2E illustrates an enlarged view showing section AA of FIG. 2D. FIG. 2F illustrates an enlarged view showing B of FIG. 2B. FIG. 2G illustrates an enlarged view showing section C of FIG. 2B.

Referring to FIGS. 2A and 2B, an image sensor may include a sensor chip 10. The sensor chip 10 may include a first substrate 100, a first wiring layer 800, a separation pattern 200, a dielectric layer 400, a protective pattern 470, color filters CF, a fence pattern 300, a microlens layer 500, a first passivation layer 610, and a second passivation layer 620.

The first substrate 100 may include a pixel array zone APS, an optical black zone OB, and a pad zone PAD. The pixel array zone APS may be located on a central portion of the first substrate 100. The pixel array zone APS may include a plurality of pixel sections PX. The pixels discussed with reference to FIG. 1 may be formed on corresponding pixel sections PX of the first substrate 100. For example, components of the pixels may be provided on corresponding pixel sections PX. The pixel sections PX may output photoelectric signals from incident light. The pixel sections PX may be two-dimensionally arranged in rows and columns. The rows may be parallel to a first direction D1. The columns may be parallel to a second direction D2. In the one or more embodiments, the first direction D1 may be parallel to a first surface 100a of the first substrate 100 (shown in FIG. 2D). The second direction D2 may be parallel to the first surface 100a of the first substrate 100 and may be different from the first direction D1. For example, the second direction D2 may be substantially orthogonal to the first direction D1. A third direction D3 may intersect the first direction D1 and the second direction D2. For example, the third direction D3 may be substantially perpendicular to the first surface 100a of the first substrate 100.

The pad zone PAD may be an edge region of the first substrate 100. For example, the pad zone PAD of the first substrate 100 may be provided between the pixel array zone APS and a lateral surface of the first substrate 100. That is, the pad zone PAD may surround the pixel array zone APS. The pad zone PAD may be provided thereon with bonding pads 900. The bonding pads 900 may externally output electrical signals generated from the pixel sections PX. Alternatively or additionally, external electrical signals or voltages may be transferred through the bonding pads 900 to the pixel sections PX. When the pad zone PAD is located in an edge portion of the first substrate 100, the bonding pads 900 may be easily coupled to external devices. For the brevity of description, a single bonding pad 900 will be discussed below. The optical black zone OB will be described below.

The following description will focus on the pixel array zone APS of the sensor chip 10 included in the image sensor.

Referring to FIGS. 2B, 2C, 2D, and 2E, the first substrate 100 may have a first surface 100a and a second surface 100b that are opposite to each other. The first surface 100a may be a back surface of the first substrate 100, and the second surface 100b may be a front surface of the first substrate 100. The first substrate 100 may receive light on the first surface 100a. The first substrate 100 may be a semiconductor substrate or a silicon-on-insulator (SOI) substrate. The semiconductor substrate may be, for example, a silicon substrate, a germanium substrate, or a silicon-germanium substrate. The first substrate 100 may further include a III-group element. The III-group element may be an impurity having a first conductivity type. Therefore, the first substrate 100 may have the first conductivity type. For example, impurities having the first conductivity type impurity may include p-type impurities, such as one or more of aluminum (Al), boron (B), indium (In), and gallium (Ga).

The pixel sections PX of the first substrate 100 may include a first pixel section PX1 and a second pixel section PX2 (hereinafter "the first and second pixel sections PX1 and PX2"). The first and second pixel sections PX1 and PX2 of the first substrate 100 may be adjacent to each other in the first direction D1 or the second direction D2. However, the first and second pixels sections PX1 and PX2 of the first substrate 100 may not be adjacent to each other in a first diagonal direction D4. The first diagonal direction D4 may be parallel to the first surface 100a of the first substrate 100, and may intersect the first direction D1 and the second direction D2. For example, an angle between the first diagonal direction D4 and the first direction D1 may be about 45 degrees, but the disclosure is not limited thereto.

The first substrate 100 may include photoelectric conversion regions PD. The photoelectric conversion regions PD may be interposed between the first and second surfaces 100a and 100b of the first substrate 100. The photoelectric conversion regions PD may be provided on corresponding pixel sections PX in the first substrate 100. The photoelectric conversion regions PD may have the same function and operation as that of the photoelectric conversion region PD shown in FIG. 1. The photoelectric conversion regions PD may include a V-group element. The V-group element may be an impurity having a second conductivity type. The photoelectric conversion regions PD may be areas where the first substrate 100 is doped with second conductivity type impurities. The second conductivity type impurities may have a conductivity type opposite to that of the first conductivity type impurities. The second conductivity type impurities may include n-type impurities, such as one or more of phosphorus, arsenic, bismuth, and antimony. The photoelectric conversion regions PD may be provided deep below the second surface 100b of the first substrate 100.

The first substrate 100 may be provided with a separation pattern 200 that defines the pixel sections PX. For example, the separation pattern 200 may be provided between the pixel sections PX of the first substrate 100. The separation pattern 200 may be a pixel isolation pattern. The separation pattern 200 may be provided in a first trench 201, and the first trench 201 may be recessed from the second surface 100b of the first substrate 100. The separation pattern 200 may be a deep trench isolation (DTI) layer. The separation pattern 200 may penetrate the first and second surfaces 100a and 100b of the first substrate 100. As shown in FIG. 2D, the separation pattern 200 may have a top surface having a width that is smaller than a width W at a bottom surface of the separation pattern 200. In this case, the top surface of the separation pattern 200 may be coplanar with the first surface 100a of the first substrate 100.

The separation pattern 200, as shown in FIG. 2D, may include a first separation pattern 210 and a second separation pattern 220. The first separation pattern 210 may be provided along a sidewall of the first trench 201. The first separation pattern 210 may include one or more of silicon-based dielectric materials (e.g., silicon nitride, silicon oxide, and/or silicon oxynitride) and high-k dielectric materials (e.g., hafnium oxide and/or aluminum oxide). Alternatively or additionally, the first separation pattern 210 may include a plurality of layers, and the plurality of layers may include different materials from each other. The first separation pattern 210 may have a refractive index that is smaller than a refractive index of the first substrate 100. Accordingly, crosstalk issues may be prevented or reduced between the pixel sections PX of the first substrate 100.

The second separation pattern 220 may be provided in the first separation pattern 210. The first separation pattern 210 may be interposed between the second separation pattern 220 and the first substrate 100. The first separation pattern 210 may separate the second separation pattern 220 from the first substrate 100. Therefore, when the image sensor operates, the second separation pattern 220 may be electrically separated from the first substrate 100. The second separation pattern 220 may include a crystalline semiconductor material, for example, polysilicon. For example, the second separation pattern 220 may further include dopants, and the dopants may include first conductivity type impurities or second conductivity type impurities. For example, the second separation pattern 220 may include doped polysilicon.

The color filters CF may be disposed on the first surface 100a of the first substrate 100 in corresponding pixel sections PX. For example, the color filters CF may be provided to respectively correspond to the photoelectric conversion regions PD. Each of the color filters CF may include one of red, blue, and green filters. The color filters CF may constitute color filter arrays. For example, the color filters CF may form a matrix array along the first direction D1 and the second direction D2.

The fence pattern 300 may be provided on the separation pattern 200. For example, the fence pattern 300 may vertically overlap the separation pattern 200. The fence pattern 300 may have a plate shape that corresponds to the shape of the top surface of the separation pattern 200. For example, the fence pattern 300 may have a grid shape in a plan view. The fence pattern 300 may surround each of the color filters CF in a plan view. The fence pattern 300 may be interposed between two neighboring color filters CF. The fence pattern 300 may physically and optically separate a plurality of color filters CF from each other. The fence pattern 300 may include a low-refractive material. The low-refractive material may include a polymer and silica nano-particles in the polymer. The low-refractive material may have dielectric properties. Alternatively or additionally, the fence pattern 300 may include one or more of metal and metal nitride. For example, the fence pattern 300 may include one or more of titanium and titanium nitride.

The dielectric layer 400 may be interposed between the first substrate 100 and the color filters CF and between separation pattern 200 and the fence pattern 300. The dielectric layer 400 may be disposed on the first surface 100a of the first substrate 100 and the top surface of the separation pattern 200. The dielectric layer 400 may be a backside dielectric layer. The dielectric layer 400 may include a bottom antireflective coating (BARC) layer. The dielectric layer 400 may include a plurality of layers, and the plurality of layers may have different functions from each other. For example, the dielectric layer 400 may include at least one of a fixed charge layer, a buried dielectric layer, a silicon nitride layer, and a capping layer. The fixed charge layer, the buried dielectric layer, the silicon nitride layer, and the capping layer may be stacked on the first surface 100*a* of the first substrate 100. For example, the fixed charge layer may include metal oxide or metal fluoride that includes at least one metal selected from hafnium (Hf), zirconium (Zr), aluminum (Al), tantalum (Ta), titanium (Ti), yttrium (Y), and lanthanide. For example, the fixed charge layer may include aluminum oxide and hafnium oxide that are stacked. The buried dielectric layer may include tetraethylorthosilicate (TEOS) or silicon oxide. The capping layer may include metal oxide, such as hafnium oxide.

The protective pattern 470 may be conformally disposed on a top surface of the dielectric layer 400, sidewalls of the fence pattern 300, and a top surface of the fence pattern 300. For example, a thickness of the dielectric layer 400 on the sidewall of the fence pattern 300 may be substantially the same as that of the dielectric layer 400 on the top surface of the fence pattern 300. The protective pattern 470 may include a high-k dielectric material and have dielectric properties. For example, the protective pattern 470 may include aluminum oxide or hafnium oxide. The protective pattern 470 may protect the photoelectric conversion regions PD of the first substrate 100 against external environment.

The microlens layer 500 may be provided on the first surface 100*a* of the first substrate 100. For example, the microlens layer 500 may be disposed on the color filters CF and the fence pattern 300. The microlens layer 500 may include a first lens pattern 510, a second lens pattern 520, and a planarized part 530. The planarized part 530 of the microlens layer 500 may be provided on the color filters CF. The first lens pattern 510 and the second lens pattern 520 may be provided on the planarized part 530. The first lens pattern 510 and the second lens pattern 520 may be integrally formed with the planarized part 530 and may be connected to each other with no boundary therebetween. The first lens pattern 510 and the second lens pattern 520 may include the same material as that of the planarized part 530. The second lens pattern 520 may include the same material as the first lens pattern 510. Alternatively, the planarized part 530 may be omitted, and the first lens pattern 510 and the second lens pattern 520 may be directly located on the color filters CF.

Each of the first and second lens patterns 510 an 520 may have a hemispheric shape and condense incident light. The first and second lens patterns 510 and 520 may be provided on positions that correspond to those of the photoelectric conversion regions PD included in the first substrate 100. For example, the first lens pattern 510 may be provided on the photoelectric conversion region PD of the first pixel section PX1 included in the first substrate 100.

The microlens layer 500 may have a top surface that includes a first curved surface 510*a*, a second curved surface 520*a*, and a first point 590. The first point 590 of the microlens layer 500 may be a position where the first curved surface 510*a* meets the second curved surface 520*a*. The first point 590 may be a lowermost portion at the top surface of the microlens layer 500. According to embodiments, the shape of the top surface of the microlens layer 500 may be different from the curved surface shown in FIGS. 2B, 2D and 2E.

The first lens pattern 510 may have the first curved surface 510*a*. The first curved surface 510*a* may be a top surface of the first lens pattern 510. The first curved surface 510*a* may be convex upwards. The first lens pattern 510 may have a central region and an edge region in a plan view. The central region of the first lens pattern 510 may include an uppermost portion of the first curved surface 510*a*. In a plan view, the central region of the first lens pattern 510 may further include a region within about 30 nm from the uppermost portion of the first curved surface 510*a*. The edge region of the first lens pattern 510 may be adjacent to the first point 590. For example, in a plan view, an interval between the first point 590 and the edge region of the first lens pattern 510 may be smaller than an interval between the uppermost portion of the first curved surface 510*a* and the edge region of the first lens pattern 510. In a plan view, the interval between the first point 590 and the edge region of the first lens pattern 510 may be equal to or smaller than about 50 nm.

As shown in FIG. 2C, the second lens pattern 520 and the first lens pattern 510 may be disposed side by side in the first direction D1 or the second direction D2. The second lens pattern 520 may be provided on the photoelectric conversion region PD of the second pixel section PX2 included in the first substrate 100.

The second lens pattern 520 may have the second curved surface 520*a*. The second curved surface 520*a* may be convex upwards. The second curved surface 520*a* may be a top surface of the second lens pattern 520. In a plan view, the second lens pattern 520 may have a central region and an edge region. The central region of the second lens pattern 520 may include an uppermost portion of the second curved surface 520*a*. In a plan view, the central region of the second lens pattern 520 may further include a region within about 30 nm from the uppermost portion of the second curved surface 520*a*. The edge region of the second lens pattern 520 may be adjacent to the first point 590. In a plan view, An interval between the first point 590 and the edge region of the second lens pattern 520 may be equal to or smaller than about 50 nm.

The microlens layer 500 may be transparent to allow light to pass therethrough. The microlens layer 500 may include an organic material, such as a polymer. For example, the microlens layer 500 may include a photoresist material or a thermosetting resin.

The microlens layer 500 may be provided thereon with the first passivation layer 610 disposed on the first lens pattern 510 and the second lens pattern 520. For example, the first passivation layer 610 may be disposed on the first curved surface 510*a* of the first lens pattern 510, the second curved surface 520*a* of the second lens pattern 520, and the first point 590. The first passivation layer 610 may have a substantially uniform thickness. As shown in FIG. 2E, the first passivation layer 610 may have a first thickness T101 in the central region of the first lens pattern 510. The first thickness T101 may be about 100 Å to about 200 Å.

It may be difficult to deposit a layer having a certain thickness on a position where curved surfaces meet each other. When the first passivation layer 610 exposes the first point 590 of the microlens layer 500, the microlens layer 500 may be damaged at the first point 590. For example, voids may be created in the microlens layer 500. According to embodiments, the first passivation layer 610 may not expose the top surface of the microlens layer 500. Therefore, the microlens layer 500 may be prevented from being damaged. For example, the first passivation layer 610 may satisfactorily cover the first point 590 of the microlens layer 500. For example, the first passivation layer 610 on the first point 590 may have a thickness T109 of about 100 Å to about 200 Å. Therefore, it may be possible to effectively prevent the formation of voids in the microlens layer 500. The thickness T109 of the first passivation layer 610 on the first point 590 of the microlens layer 500 may be about 60% to about 100% of the first thickness T101. The first passivation layer 610 may have a first edge thickness T108 in the edge region of the first lens pattern 510. The first edge thickness T108 may be about 60% to about 100% of the first thickness T101. The first edge thickness T108 may be about 100 Å to about 200 Å. Therefore, the first passivation layer 610 may effectively protect the first point 590 of the microlens layer 500 and a top surface at the edge region of the first lens pattern 510.

At the central region of the second lens pattern 520, the first passivation layer 610 may have a thickness T102, which is the same as or similar to the first thickness T101. For example, in the central region of the second lens pattern 520, the thickness T102 of the first passivation layer 610 may be about 90% to about 110% of the first thickness T101. In the central region of the second lens pattern 520, the thickness T102 of the first passivation layer 610 may be about 100 Å to about 200 Å. The thickness T109 of the first passivation layer 610 on the first point 590 of the microlens layer 500 may be about 60% to about 100% of the thickness T102 of the first passivation layer 610 in the central region of the second lens pattern 520, and likewise, a thickness of the first passivation layer 610 in the edge region of the second lens pattern 520 may be about 60% to about 100% of the thickness T102 of the first passivation layer 610 in the central region the second lens pattern 520. Each of the thickness T102 of the first passivation layer 610 in the central region of the second lens pattern 520, and the thickness of the first passivation layer 610 in the edge region of the second lens pattern 520 may be about 100 Å to about 200 Å.

The first passivation layer 610 may include one or more of an organic material and an inorganic material. The first passivation layer 610 may further include a surfactant. According to embodiments, the first passivation layer 610 may include a silicon-containing material such as one or more of silicon oxide, silicon nitride, silicon oxynitride, silicon carbide, silicon carbon oxide, silicon carbon nitride, and silicon carbon oxynitride. Alternatively or additionally, the first passivation layer 610 may include one or more of aluminum oxide, zinc oxide, and hafnium oxide. The first passivation layer 610 may have dielectric properties, but the disclosure is not limited thereto. The first passivation layer 610 may allow light to pass therethrough.

The second passivation layer 620 may be provided on the first passivation layer 610. The second passivation layer 620 may have a second thickness T201 in the central region of the first lens pattern 510. The second thickness T201 may be a maximum thickness of the second passivation layer 620 on the first lens pattern 510. The second thickness T201 may be about 700Å to about 1,900 Å. The second passivation layer 620 may have an irregular thickness. A thickness difference of the second passivation layer 620 may be greater than that of the first passivation layer 610. For example, the thickness T209 of the second passivation layer 620 on the first point 590 of the microlens layer 500 may be equal to or smaller than about 40% of the second thickness T201. The phrase "equal to or smaller than about 40% of the second thickness T201" may include "about 0% of the second thickness T201." The expression "about 0% of the second thickness T201" may indicate "the second passivation layer 620 is not provided on the first point 590 of the microlens layer 500." In this case, the second passivation layer 620 may be provided on the central region of the first lens pattern 510, but not on the first point 590. The thickness T109 of the first passivation layer 610 on the first point 590 of the microlens layer 500 may be equal to or smaller than about 500 Å.

The second passivation layer 620 may have a second edge thickness T208 in the edge region of the first lens pattern 510. The second edge thickness T208 may be equal to or smaller than about 40% of the second thickness T201. For example, the second edge thickness T208 may be equal to or smaller than about 500 Å. Alternatively, the second passivation layer 620 may not be provided in the edge region of the first lens pattern 510.

A sum of the first and second thicknesses T101 and T201 may be about 800 Å to about 2,000 Å. When the sum of the first and second thicknesses T101 and T201 is smaller than about 800 Å, the microlens layer 500 may be damaged during a packaging process of the image sensor. One or more of the first and second passivation layers 610 and 620 may serve as an antireflective layer (ARL). For example, each of the first and second passivation layers 610 and 620 may serve as an antireflective layer. When the sum of the first and second thicknesses T101 and T201 is greater than about 2,000 Å or smaller than about 800 Å, the image sensor may decrease in optical properties. According to embodiments, as the sum of the first and second thicknesses T101 and T201 is in a range of about 800 Å to about 2,000 Å, the image sensor may increase in optical properties and the microlens layer 500 may be protected.

At the central region of the second lens pattern 520, the thickness T202 of the second passivation layer 620 may be about 700 Å to about 1,900 Å. The thickness T209 of the second passivation layer 620 on the first point 590 of the microlens layer 500 may be equal to or smaller than about 40% of the thickness T202 of the second passivation layer 620 in the central region the second lens pattern 520, and likewise the thickness T208 of the second passivation layer 620 in the edge region of the second lens pattern 520 may be equal to or smaller than about 40% of the thickness T202 of the second passivation layer 620 in the central region the second lens pattern 520. In the central region of the second lens pattern 520, the thickness T202 of the second passivation layer 620 may be equal to or smaller than about 500 Å.

The first passivation layer 610 may be denser than the second passivation layer 620. For example, the first passivation layer 610 may have a density greater than a density of the second passivation layer 620.

The second passivation layer 620 may include a material the same as or different from that of the first passivation layer 610. The second passivation layer 620 may include one or more of an organic material and an inorganic material. The second passivation layer 620 may further include a surfactant. According to embodiments, the second passivation layer 620 may include a silicon-containing material such as one or more of silicon oxide, silicon nitride, silicon oxynitride, silicon carbide, silicon carbon oxide, silicon carbon nitride, and silicon carbon oxynitride. Alternatively or additionally, the second passivation layer 620 may include one or more of aluminum oxide, zinc oxide, and hafnium oxide. The second passivation layer 620 may have dielectric properties, but the disclosure is not limited thereto.

As shown in FIG. 2D, the first substrate 100 may include impurity regions 111. The first substrate 100 may be provided therein with the impurity regions 111 in corresponding pixel sections PX. The impurity regions 111 may be disposed adjacent to the second surface 100b of the first substrate 100. The impurity regions 111 may be spaced apart from the photoelectric conversion regions PD. The impurity regions 111 may be areas doped with second conductivity type impurities (e.g., n-type impurities). The impurity regions 111 may be active regions. The active regions may indicate areas for the operation of a transistor, and may include source/drain regions of the transistor and the floating diffusion region FD discussed with reference to FIG. 1. The transistor may include the transfer transistor Tx, the source follower transistor Sx, the reset transistor Rx, or the selection transistor Ax that are discussed with reference to FIG. 1.

A device isolation pattern 240 may be provided in the first substrate 100. The device isolation pattern 240 may define the active regions. For example, in each pixel section PX, the device isolation pattern 240 may be disposed between the impurity regions 111, and separate the impurity regions 111 from each other. For example, the first substrate 100 may be provided therein with the device isolation pattern 240 at one side of an impurity region 111. The device isolation pattern 240 may be provided in a second trench, and the second trench may be recessed from the second surface 100b of the first substrate 100. The device isolation pattern 240 may be a shallow trench isolation (STI) layer. For example, the device isolation pattern 240 may have a height smaller than that of the separation pattern 200. A portion of the device isolation pattern 240 may further be connected to a sidewall of the first separation pattern 210. The device isolation pattern 240 may include, for example, one or more of silicon oxide, silicon nitride, and silicon oxynitride.

A gate pattern 700 may be located on the second surface 100b of the first substrate 100. The gate pattern 700 may serve as a gate electrode of one of the transfer transistor Tx, the source follower transistor Sx, the reset transistor Rx, and the selection transistor Ax that are discussed above with reference to FIG. 1. For example, the gate pattern 700 may include one of the transfer gate TG, the source follower gate SG, the reset gate RG, and the selection gate AG. For the brevity of description, FIGS. 2B and 2D depict that a single gate pattern 700 is provided in each pixel section PX, but a plurality of gate patterns 700 may be disposed in each pixel section PX. A single gate pattern 700 will be discussed below for the brevity of description.

The gate pattern 700 may have a buried gate structure. For example, the gate pattern 700 may include a first part 710 and a second part 720. The first part 710 of the gate pattern 700 may be disposed on the second surface 100b of the first substrate 100. The second part 720 of the gate pattern 700 may protrude into the first substrate 100. The second part 720 of the gate pattern 700 may be provided on a top surface of the first part 710 and may be connected to the first part 710. Alternatively or additionally, the gate pattern 700 may have a planar gate structure, in which case the gate pattern 700 may not include the second part 720. The gate pattern 700 may include metal, metal silicide, polysilicon, or any combination thereof. In this case, the polysilicon may include doped polysilicon.

A gate dielectric pattern 740 may be interposed between the gate pattern 700 and the first substrate 100. The gate dielectric pattern 740 may include, for example, one or more of silicon-based dielectric materials (e.g., silicon oxide, silicon nitride, and/or silicon oxynitride) and high-k dielectric materials (e.g., hafnium oxide and/or aluminum oxide).

The first wiring layer 800 may be located on the second surface 100b of the first substrate 100. The first wiring layer 800 may include first lower dielectric layers 810, second lower dielectric layers 820, and first conductive structures 830. The first lower dielectric layer 810 may be disposed on the second surface 100b of the first substrate 100. The second lower dielectric layers 820 may be stacked on the first lower dielectric layer 810. The first and second lower dielectric layers 810 and 820 may include a silicon-based dielectric material, such as one or more of silicon oxide, silicon nitride, and silicon oxynitride.

The first conductive structures 830 may be provided in the first and second lower dielectric layers 810 and 820. The first conductive structures 830 may each include a contact plug part, a wire part, and a via part. The contact plug part may be provided in the first lower dielectric layer 810 and may be electrically connected to one of the gate pattern 700 and the impurity regions 111. The wire part of the first conductive structure 830 may be interposed between two neighboring ones of the first and second lower dielectric layers 810 and 820. The wire part may be connected to the contact plug part. The via part of the first conductive structure 830 may penetrate at least one of the second lower dielectric layers 820 and may have a connection with the wire part. The first conductive structures 830 may receive photoelectric signals that are output from the photoelectric conversion regions PD.

The following will describe a circuit chip 20 of the image sensor, and the optical black zone OB and the pad zone PAD of the first substrate 100.

Referring back to FIGS. 2A and 2B, the optical black zone OB of the first substrate 100 may be interposed between the pixel array zone APS and the pad zone PAD. As shown in FIG. 2B, the optical black zone OB may include a first reference pixel section RPX1 and a second reference pixel section RPX2. Here, the second reference pixel section RPX2 may include one or more second reference pixel sections RPX2. The first reference pixel section RPX1 may be disposed between the second reference pixel section RPX2 and the pixel array zone APS. On the optical black zone OB, the photoelectric conversion region PD may be provided in the first reference pixel section RPX1. The photoelectric conversion region PD in the first reference pixel section RPX1 may have a planar area and a volume that are the same as those of each of the photoelectric conversion regions PD in the pixel sections PX. The photoelectric conversion region PD may not be provided in the second reference pixel section RPX2. The impurity regions 111, the gate pattern 700, and the device isolation pattern 240 may be provided in each of the first and second reference pixel sections RPX1 and RPX2. The impurity regions 111, the gate pattern 700, and the device isolation pattern 240 may be identical or similar to those discussed in FIG. 2D.

The dielectric layer 400 may extend into the optical black zone OB and the pad zone PAD of the first substrate 100, and may be disposed on the first surface 100a of the first substrate 100.

The image sensor may further include a light-shield layer 950 and an organic layer 501. The optical black zone OB may have thereon the light-shield layer 950 and the organic layer 501 provided on the first surface 100a of the first substrate 100. The light-shield layer 950 may be provided on the top surface of the dielectric layer 400. The light-shield layer 950 may prevent light from entering the photoelectric conversion region PD on the optical black zone OB. On the optical black zone OB, pixels of the first and second reference pixel sections RPX1 and RPX2 may output noise signals without outputting photoelectric signals. The noise signals may be generated from electrons produced due to heat or dark current. The light-shield layer 950 may not cover the pixel array zone APS, and thus light may be incident on the photoelectric conversion regions PD in the pixel array zone APS. The noise signals may be removed from photoelectric signals that are output from the pixel sections PX. The light-shield layer 950 may include metal, such as tungsten, copper, aluminum, or any alloy thereof.

The organic layer 501 may be disposed on the light-shield layer 950. The organic layer 501 may be transparent. The organic layer 501 may have a top surface that is substantially flat and opposite to the first substrate 100. The organic layer 501 may include, for example, a polymer. The organic layer 501 may have dielectric properties. For example, the organic layer 501 may include the same material as that of the fence patterns 300. As another example, the organic layer 501 may include the same material as that of the microlens layer 500, in which case the organic layer 501 may be connected to the microlens layer 500, but the disclosure is not limited thereto.

The image sensor may further include at least one selected from a contact plug 960, a first conductive pattern 911, a protective dielectric layer 471, and a filtering layer 550.

The optical black zone OB and the pad zone PAD may have the first conductive pattern 911 provided on the first surface 100a of the first substrate 100. The first conductive pattern 911 may be disposed between the dielectric layer 400 and the light-shield layer 950. The first conductive pattern 911 may serve as a barrier layer or an adhesion layer. The first conductive pattern 911 may include one or more of metal and metal nitride. For example, the first conductive pattern 911 may include one or more of titanium and titanium nitride. The first conductive pattern 911 may not extend into the pixel array zone APS of the first substrate 100.

The contact plug 960 may be disposed in the dielectric layer 400 on a top surface at an outermost portion of the separation pattern 200. A contact trench may be formed on the first surface 100a of the first substrate 100, and the contact plug 960 may be provided in the contact trench. An upper portion of the contact plug 960 may be provided in the light-shield layer 950. The contact plug 960 may include a different material from that of the light-shield layer 950. For example, the contact plug 960 may include a metallic material, such as aluminum. The first conductive pattern 911 may extend between the contact plug 960 and the dielectric layer 400 and between the contact plug 960 and the separation pattern 200. The contact plug 960 may be electrically connected through the first conductive pattern 911 to the second separation pattern 220. Therefore, a negative bias voltage may be applied through the contact plug 960 to the second separation pattern 220.

The filtering layer 550 may be interposed between the light-shield layer 950 and the organic layer 501. The filtering layer 550 may block light whose wavelength is different from that of light produced from the color filters CF. For example, the filtering layer 550 may block an infrared ray. The filtering layer 550 may include a blue color filter, but the disclosure is not limited thereto.

The protective dielectric layer 471 may be interposed between the light-shield layer 950 and the filtering layer 550. The protective dielectric layer 471 may be disposed on a top surface of the light-shield layer 950 and a top surface of the contact plug 960. The protective dielectric layer 471 may include the same material as that of the protective pattern 470 and may have connection with the protective pattern 470. The protective dielectric layer 471 and the protective pattern 470 may be integrally formed with each other. Alternatively, the protective dielectric layer 471 may be formed in a process separated from that used for forming the protective pattern 470, and may be spaced apart from the protective pattern 470. The protective dielectric layer 471 may include a high-k dielectric material (e.g., aluminum oxide and/or hafnium oxide).

The first wiring layer 800 may be provided on the second surface 100b of the first substrate 100, and may extend into the optical black zone OB and the pad zone PAD of the first substrate 100.

The image sensor may further include the circuit chip 20. The circuit chip 20 may be stacked on a bottom surface of the sensor chip 10. The circuit chip 20 may include a second wiring layer 1800 and a second substrate 1000. The second wiring layer 1800 may be interposed between the first wiring layer 800 and the second substrate 1000. Integrated circuits 1700 may be provided on a top surface or in the second substrate 1000. The integrated circuits 1700 may include logic circuits, memory circuits, or a combination thereof. The integrated circuits 1700 may include, for example, transistors. The second wiring layer 1800 may include third lower dielectric layers 1820 and second conductive structures 1830. Each of the second conductive structures 1830 may include a wire pattern and a via pattern. The wire pattern may be provided between the third lower dielectric layers 1820. The via pattern may be provided in the third lower dielectric layers 1820. The second conductive structures 1830 may be electrically connected to the integrated circuits 1700. The second conductive structures 1830 may include metal. The following description will describe a single second conductive structure 1830.

The pad zone PAD may include the bonding pad 900 disposed on the first surface 100a of the first substrate 100. The bonding pad 900 may be embedded in the first substrate 100. For example, on the pad zone PAD, a pad trench 990 may be formed on the first surface 100a of the first substrate 100, and the bonding pad 900 may be provided in the pad trench 990. The bonding pad 900 may include metal, such as aluminum, copper, tungsten, titanium, tantalum, or any alloy thereof. In a manufacturing process of the image sensor, a bonding wire may be formed on and coupled to the bonding pad 900. The bonding pad 900 may be electrically connected through the bonding wire to an external device.

A first through hole 901 may be provided on a first side of the bonding pad 900 between the bonding pad 900 and the contact plug 960. The first through hole 901 may penetrate the dielectric layer 400, the first substrate 100, and the first wiring layer 800. The first through hole 901 may further penetrate at least a portion of the second wiring layer 1800. The first through hole 901 may have a first bottom surface and a second bottom surface. The first bottom surface of the first through hole 901 may expose the first conductive structure 830. The second bottom surface of the first through hole 901 may be disposed at a lower level than that of the first bottom surface of the first through hole 901. The second bottom surface of the first through hole 901 may expose the second conductive structure 1830.

The first conductive pattern 911 may extend to the pad zone PAD of the first substrate 100 on the dielectric layer 400. The first conductive pattern 911 may be disposed on an inner sidewall of the first through hole 901. The bonding pad 900 may be provided in plural as shown in FIG. 2A. The plurality of bonding pads 900 may include a first bonding pad and a second bonding pad. Although not shown, the first conductive pattern 911 may be provided on a bottom surface and a sidewall of one (or a first bonding pad) of the bonding pads 900, and may be electrically connected to the one bonding pad 900 (or the first bonding pad). The first conductive pattern 911 may be disposed on the sidewall and the first bottom surface of the first through hole 901. The first conductive pattern 911 may be in contact with a top surface of the first conductive structure 830. Therefore, the first conductive structure 830 may be electrically connected through the first conductive pattern 911 to the one bonding pad 900 (or the first bonding pad). When the image sensor operates, a voltage may be applied to the first conductive structure 830 through the first conductive pattern 911 and the one bonding pad 900. The voltage may also be applied to the second separation pattern 220 through the first conductive pattern 911 and the contact plug 960. The voltage may be a negative bias voltage.

The first conductive pattern 911 may be disposed on the second bottom surface of the first through hole 901, and may be coupled to a top surface of the second conductive structure 1830. The integrated circuits 1700 of the circuit chip 20 may be electrically connected to the one bonding pad 900 (or the first bonding pad) through the second conductive structure 1830 and the first conductive pattern 911. Although not shown, the first conductive pattern 911 and the first through hole 901 may each be provided in plural. For example, one of the plurality of first conductive patterns 911 may be coupled to the first conductive structure 830 or the second conductive structure 1830, without being coupled to the contact plug 960. The one first conductive pattern 911 may serve as an electrical path between the integrated circuit 1700 of the circuit chip 20 and a transistor of the sensor chip 10. The first conductive patterns 911 may include metal, such as copper, tungsten, aluminum, titanium, tantalum, or any alloy thereof. The following will describe a single first conductive pattern 911.

The image sensor may further include at least one of a first buried pattern 921 and a first capping pattern 931. The first buried pattern 921 and the first capping pattern 931 may be provided in the pad zone PAD of the first substrate 100. The first buried pattern 921 may be provided in the first through hole 901 to be disposed on the first conductive pattern 911. The first buried pattern 921 may fill at least a portion of the first through hole 901. The first buried pattern 921 may not extend into the first surface 100*a* of the first substrate 100. The first buried pattern 921 may include a low-refractive material and may have dielectric properties. The first buried pattern 921 may include the same material as the material of the fence pattern 300. For example, the first buried pattern 921 may include a polymer and silica nano-particles in the polymer. The first buried pattern 921 may have a concave top surface. For example, the top surface of the first buried pattern 921 may have a central portion located at a lower level than that of an edge portion of the top surface of the first buried pattern 921.

The first capping pattern 931 may be disposed on the top surface of the first buried pattern 921. The first capping pattern 931 may have a top surface that is substantially flat. The filtering layer 550 may be disposed on the top surface of the first capping pattern 931. The first capping pattern 931 may include a dielectric polymer, such as a photoresist material.

A second through hole 902 may be located on a second side of the bonding pad 900. The second side of the bonding pad 900 may be different from the first side of the bonding pad 900. The second through hole 902 may penetrate the dielectric layer 400, the first substrate 100, and the first wiring layer 800. The second through hole 902 may further penetrate a portion of the second wiring layer 1800 and may expose the second conductive structure 1830.

The image sensor may further include a second conductive pattern 912, a second buried pattern 922, and a second capping pattern 932. The second conductive pattern 912 may be provided on the first surface 100*a* of the first substrate 100. The second conductive pattern 912 may be interposed between the first substrate 100 and another (or a second bonding pad) of the bonding pads 900, and may be electrically connected to the another bonding pad 900 (or the second bonding pad). The second conductive pattern 912 may extend into the second through hole 902 and may be conformally disposed on a sidewall and a bottom surface of the second through hole 902. The second conductive pattern 912 may be electrically connected to the second conductive structure 1830. When the image sensor operates, the integrated circuits 1700 of the circuit chip 20 may transceive electrical signals with the second conductive structure 1830, the second conductive pattern 912, and the another bonding pad 900 (or the second bonding pad).

A second buried pattern 922 may be provided in the second through hole 902 to fill the second through hole 902. The second buried pattern 922 may not extend into the first surface 100*a* of the first substrate 100. The second buried pattern 922 may include a low-refractive material and may have dielectric properties. For example, the second buried pattern 922 may include the same material as that of one or both of the fence pattern 300 and the first buried pattern 921. The second buried pattern 922 may have a concave inward top surface, similar to the first buried pattern 921.

The second capping pattern 932 may be located on the top surface of the second buried pattern 922. The second capping pattern 932 may have a top surface that is substantially flat. The second capping pattern 932 may include a dielectric polymer, such as a photoresist material.

The protective dielectric layer 471 may extend into the pad zone PAD of the first substrate 100, and may be disposed on the first conductive pattern 911 and the second conductive pattern 912. The protective dielectric layer 471 may extend into the first through hole 901 and the second through hole 902. The first through hole 901 may be provided with the protective dielectric layer 471 interposed between the first conductive pattern 911 and the first buried pattern 921. The second through hole 902 may be provided with the protective dielectric layer 471 interposed between the second conductive pattern 912 and the second buried pattern 922. The protective dielectric layer 471 may expose the bonding pad 900.

The organic layer 501 may further be provided in the pad zone PAD of the first substrate 100. The organic layer 501 may be disposed on a portion of the protective dielectric layer 471, the first capping pattern 931, and the second capping pattern 932. The organic layer 501 may not be provided above the bonding pad 900 to expose a top surface of the bonding pad 900.

The first passivation layer 610 may extend into the optical black zone OB and the pad zone PAD of the first substrate 100 to be disposed on the organic layer 501. The first passivation layer 610 may vertically overlap the first conductive pattern 911 in the first through hole 901. The first conductive pattern 911 in the first through hole 901 may be a first through conductive pattern. The first passivation layer 610 may vertically overlap the second conductive pattern 912 in the second through hole 902. The second conductive pattern 912 in the second through hole 902 may be a second through conductive pattern. The first passivation layer 610 may be spaced apart from the bonding pad 900 and may not vertically overlap the bonding pad 900.

The second passivation layer 620 may extend into the optical black zone OB and the pad zone PAD of the first substrate 100 to be disposed on the first passivation layer 610. The second passivation layer 620 may vertically overlap the first conductive pattern 911 in the first through hole 901 and the second conductive pattern 912 in the second through hole 902. The second passivation layer 620 may be spaced apart from the bonding pad 900 and may not vertically overlap the bonding pad 900.

The following description focuses on the first and second passivation layers 610 and 620 in the optical black zone OB and the pad zone PAD of the first substrate 100.

Referring to FIGS. 2B, 2E, and 2F, the first passivation layer 610 may have a third thickness T120 in the optical black zone OB of the first substrate 100. The third thickness T120 may be relatively uniform. A difference between a maximum value and a minimum value of the third thickness T120 may be equal to or smaller than about 10%. The third thickness T120 may be equal or similar to the first thickness T101 discussed in FIG. 2E. For example, the third thickness T120 may be about 90% to about 110% of the first thickness T101. The third thickness T120 may be about 100 Å to about 200 Å. The thickness T109 of the first passivation layer 610 on the first point 590 of the microlens layer 500 discussed in FIG. 2E may be about 60% to about 100% of the third thickness T120. The first edge thickness T108 discussed in FIG. 2E may be about 60% to about 100% of the third thickness T120.

The second passivation layer 620 may have a fourth thickness T220 in the optical black zone OB of the first substrate 100. The fourth thickness T220 may be greater than the third thickness T120, and may be substantially equal or similar to the second thickness T201. The fourth thickness T220 may be about 700 Å to about 1,900 Å. The second edge thickness T208 and the thickness T209 of the second passivation layer 620 on the first point 590 of the microlens layer 500 discussed in FIG. 2E may each be equal to or smaller than about 40% of the fourth thickness T220. A sum of the third and fourth thicknesses T120 and T220 may be about 800 Å to about 2,000 Å.

Referring to FIGS. 2B, 2E, 2F, and 2G, the first passivation layer 610 may have a fifth thickness T130 in the pad zone PAD of the first substrate 100. The fifth thickness T130 may be relatively uniform. A difference between a maximum value and a minimum value of the fifth thickness T130 may be equal to or smaller than about 10%. The fifth thickness T130 may be equal or similar to the first thickness (see T101 of FIG. 2E) and the third thickness (see T120 of FIG. 2F). For example, the fifth thickness T130 may be about 90% to about 110% of the first thickness T101 and about 90% to about 110% of the third thickness T120. The fifth thickness T130 may be about 100 Å to about 200 Å. The first edge thickness T108 and the thickness T109 of the first passivation layer 610 on the first point 590 of the microlens layer 500 discussed in FIG. 2E may each be about 60% to about 100% of the fifth thickness T130.

The second passivation layer 620 may have a sixth thickness T230 in the pad zone PAD of the first substrate 100. The sixth thickness T230 may be greater than the fifth thickness T130. The sixth thickness T230 may be about 700 Å to about 1,900 Å. The second edge thickness T208 and the thickness T209 of the second passivation layer 620 on the first point 590 of the microlens layer 500 discussed in FIG. 2E may each be equal to or smaller than about 40% of the sixth thickness T230. A sum of the fifth and sixth thicknesses T130 and T230 may be about 800 Å to about 2,000 Å.

Figure 2H:
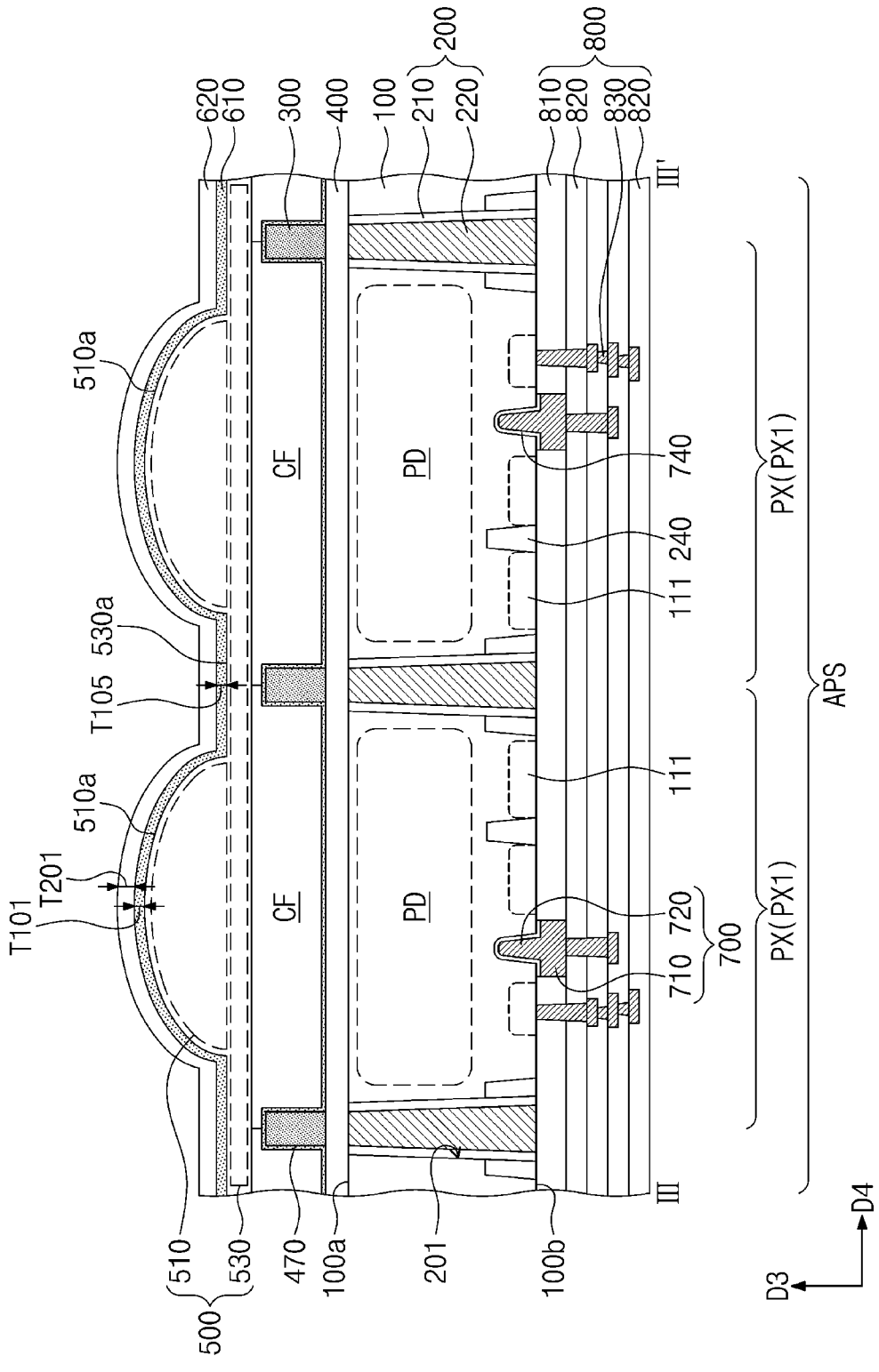
FIG. 2H illustrates a cross-sectional view taken along a line III-III' of FIG. 2C.

FIG. 2H illustrates a cross-sectional view taken along the line III-III' of FIG. 2C.

Referring to FIGS. 2C and 2H, the first lens pattern 510 may be provided in plural. The plurality of first lens patterns 510 may be arranged in the first diagonal direction D4. The first lens patterns 510 may be arranged side by side with each other, and may be connected to each other through the planarized part 530. For example, the first curved surfaces 510a of the respective first lens patterns 510 may not be in contact with each other. A top surface 530a of the planarized part 530 may be exposed between the first lens patterns 510. The top surface 530a of the planarized part 530 may be substantially flat. For example, the top surface 530a of the planarized part 530 may be substantially parallel to the first surface 100a of the first substrate 100.

The first passivation layer 610 may be disposed on the exposed top surface 530a of the planarized part 530. The first passivation layer 610 on the top surface 530a of the planarized part 530 may have a thickness T105 equal or similar to the first thickness (see T101 of FIG. 2E). For example, the thickness T105 of the first passivation layer 610 on the top surface 530a of the planarized part 530 may be about 90% to about 110% of the first thickness T101 of the first passivation layer 610. The thickness T105 of the first passivation layer 610 on the top surface 530a of the planarized part 530 may be about 90% to about 110% of the third thickness T120 depicted in FIG. 2F and about 90% to about 110% of the fifth thickness T130 depicted in FIG. 2G. The thickness T105 of the first passivation layer 610 on the top surface 530a of the planarized part 530 may be about 100 Å to about 200 Å.

The first edge thickness T108 and the thickness T109 of the first passivation layer 610 on the first point 590 of the microlens layer 500 discussed in FIG. 2E may each be about 60% to about 100% of the thickness T105 of the first passivation layer 610 on the top surface 530a of the planarized part 530.

The second passivation layer 620 on the top surface 530a of the planarized part 530 may have a thickness equal or similar to the second thickness (see T201 of FIG. 2E), but the disclosure is not limited thereto.

Figure 3A:
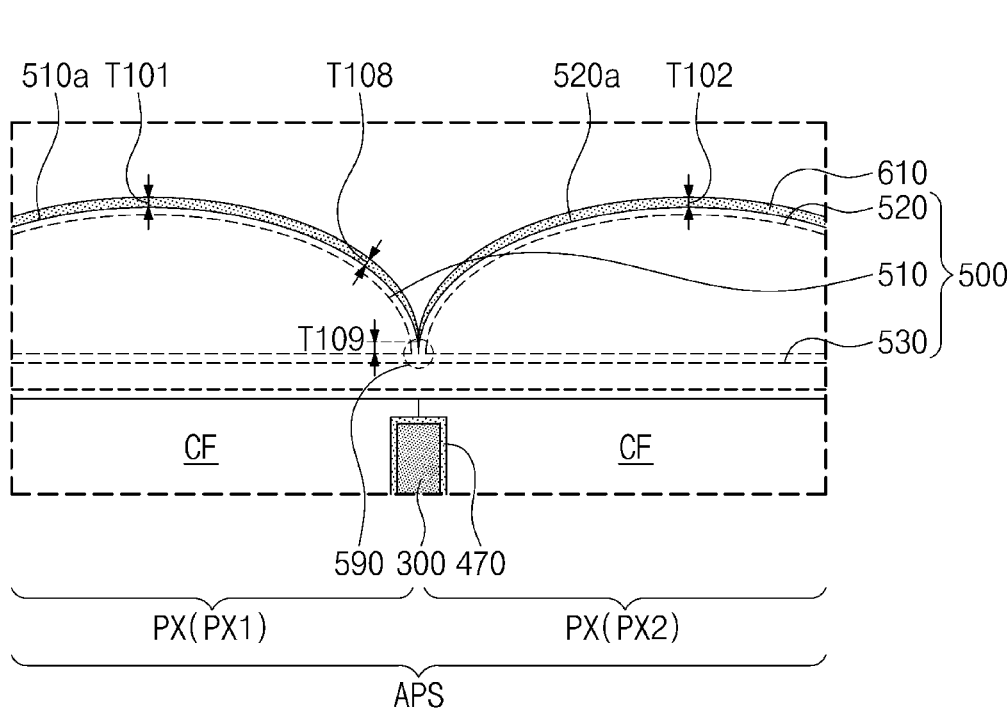
FIGS. 3A to 3C illustrate cross-sectional views showing a method of fabricating an image sensor according to embodiments.
Figure 3B:
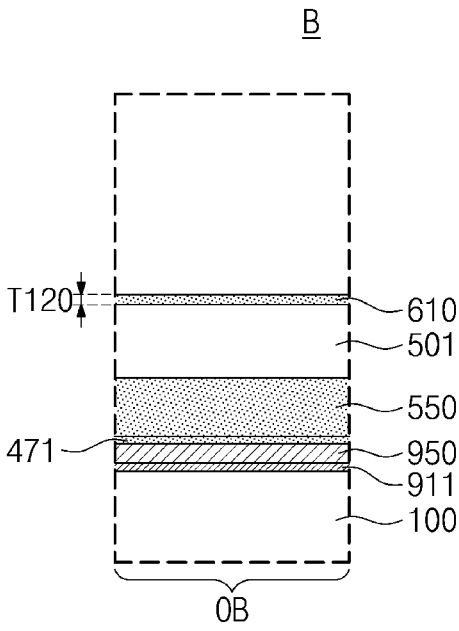
Figure 3C:
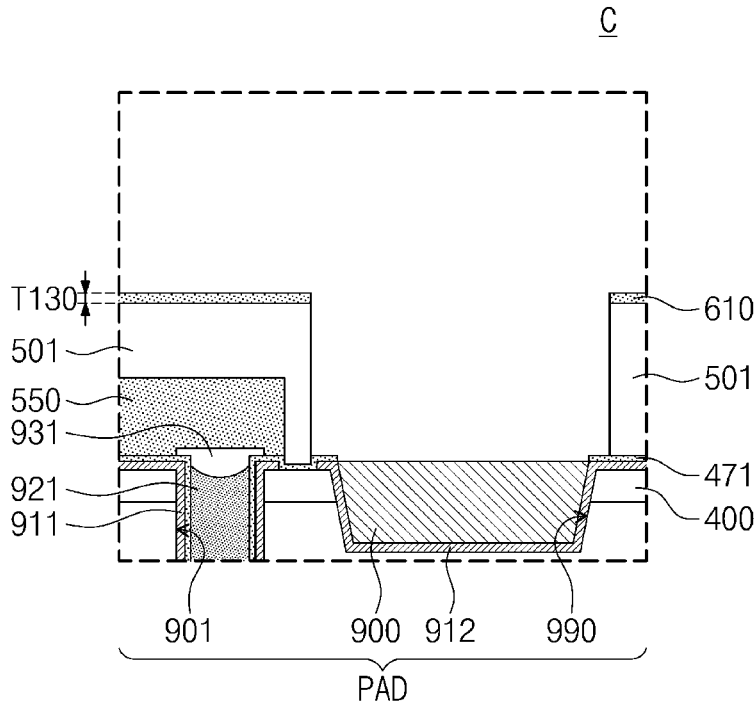

FIGS. 3A to 3C illustrate cross-sectional views showing a method of manufacturing an image sensor according to embodiments. FIG. 3A illustrates an enlarged view showing section AA of FIG. 2B. FIG. 3B illustrates an enlarged view showing section B of FIG. 2B. FIG. 3C illustrates an enlarged view showing section C of FIG. 2B.

Referring to FIGS. 2B, 3A, 3B, and 3C, an image sensor may include a first passivation layer 610, but may not include a second passivation layer (see 620 of FIG. 2B). The first passivation layer 610 may be substantially the same as the first passivation layer shown in the embodiments described above in reference to FIGS. 2A to 2H. For example, the first thickness T101, the third thickness T120, the fifth thickness T130, the thickness T109 of the first passivation layer 610 on the first point 590 of the microlens layer 500, and the first edge thickness T108 may satisfy the conditions discussed above in reference to FIGS. 2E to 2G. In contrast, the first thickness T101, the third thickness T120, and the fifth thickness T130 may be about 80 Å to about 2,000 Å, for example, from about 80 Å to about 120 Å.

Figure 4A:
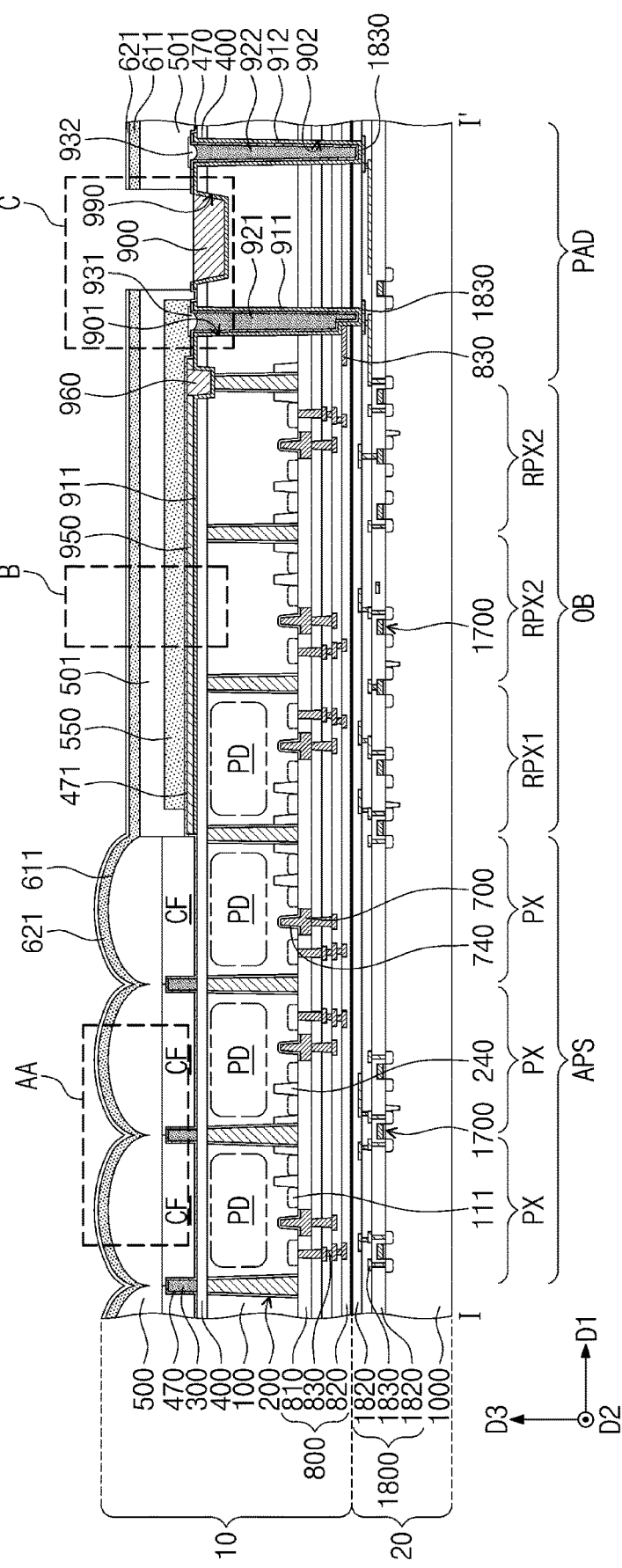
FIG. 4A illustrates a cross-sectional view showing an image sensor according to embodiments.
Figure 4B:
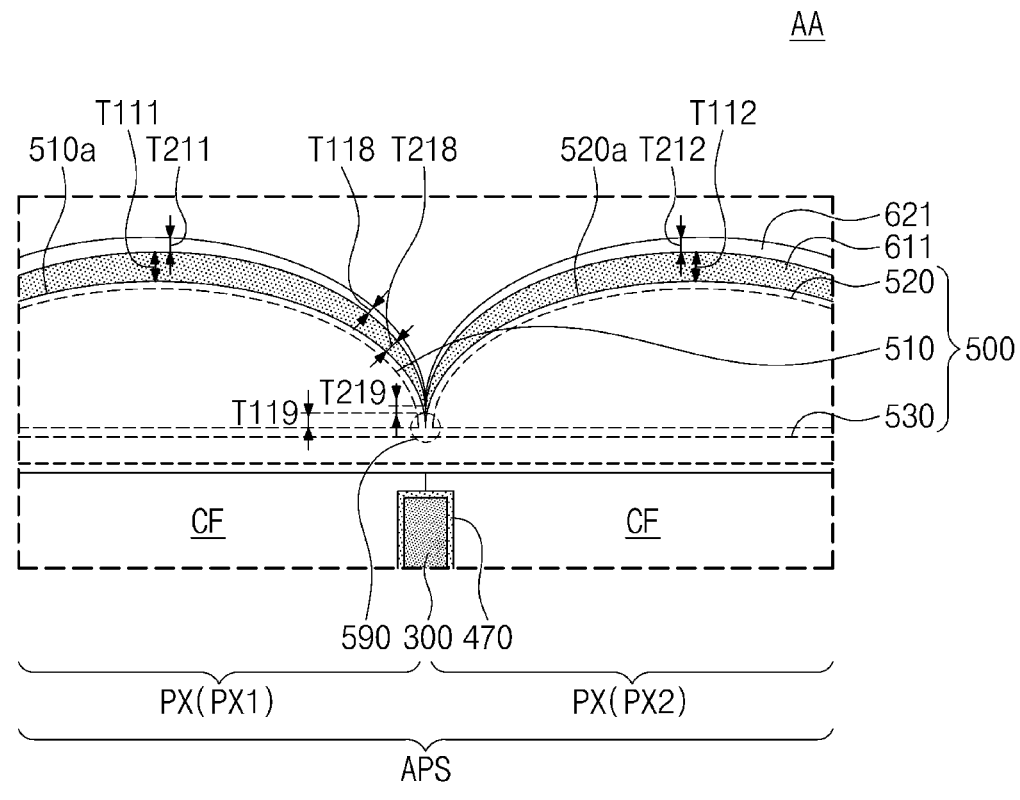
FIG. 4B illustrates an enlarged view showing section AA of FIG. 4A.
Figure 4C:
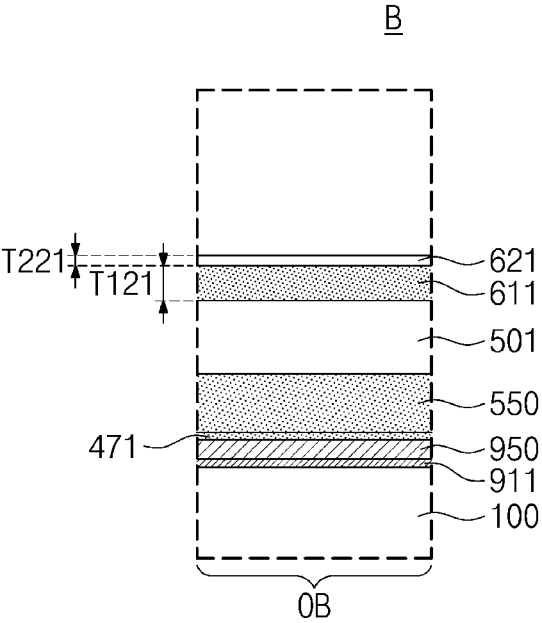
FIG. 4C illustrates an enlarged view showing section B of FIG. 4A.
Figure 4D:
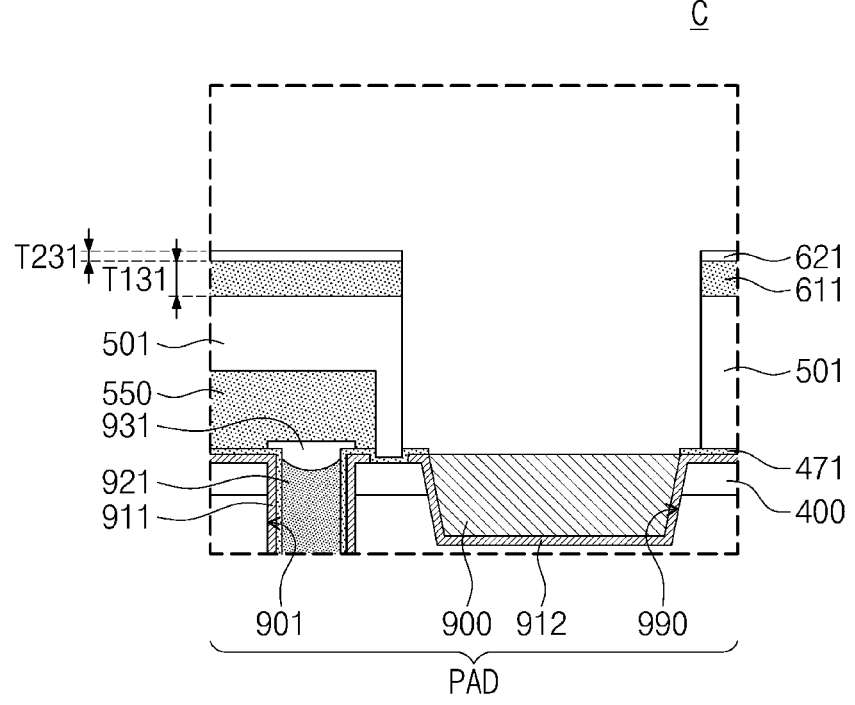
FIG. 4D illustrates an enlarged view showing section C of FIG. 4A.

FIG. 4A illustrates a cross-sectional view taken along the line I-I' of FIG. 2A, showing an image sensor according to embodiments. FIG. 4B illustrates an enlarged view showing section AA of FIG. 4A. FIG. 4C illustrates an enlarged view showing section B of FIG. 4A. FIG. 4D illustrates an enlarged view showing section C of FIG. 4A.

Referring to FIGS. 4A, 4B, 4C, and 4D, an image sensor may include a first passivation layer 611 and a second passivation layer 621. The first passivation layer 611 may overlap the pixel array zone APS, the optical black zone OB, and the pad zone PAD of the first substrate 100, and may be disposed on the microlens layer 500 and the organic layer 501. The second passivation layer 621 may be disposed on the first passivation layer 611. A displacement and material of each of the first passivation layer 611 and the second passivation layer 621 may be substantially the same as that of the first passivation layer 610 and the second passivation layer 620 discussed above in reference to FIGS. 2A to 2H.

A thickness difference of the first passivation layer 611 may be greater than that of the second passivation layer 621. For example, the first passivation layer 611 on the first point 590 of the microlens layer 500 may have a thickness T119 that is about 40% of a first thickness T111 of the first passivation layer 611 on a top surface at the central region of the first lens pattern 510. The thickness T119 of the first passivation layer 611 on the first point 590 of the microlens layer 500 may be equal to or smaller than about 500 Å. The first thickness T111 may be about 700 Å to about 1,900 Å. The first passivation layer 611 in the edge region of the first lens pattern 510 may have a first edge thickness T118. The first edge thickness T118 may be equal to or smaller than about 40% of the first thickness T111. The first edge thickness T118 may be equal to or than about 500 Å. Alternatively, the first passivation layer 611 may expose the first point 590 of the microlens layer 500.

The thickness T119 of the first passivation layer 611 on the first point 590 of the microlens layer 500 may be equal to or smaller than about 40% of a thickness T112 of the first passivation layer 611 in the central region of the second lens pattern 520.

As shown in FIG. 4C, A third thickness T121 of the first passivation layer 611 in the optical black zone OB of the first substrate 100 may be about 700 Å to about 1,900 Å. As shown in FIGS. 4B and 4C, the first edge thickness T118 and the thickness T119 of the first passivation layer 611 on the first point 590 of the microlens layer 500 may each be equal to or smaller than about 40% of the third thickness T121.

As shown in FIG. 4D, a fifth thickness T131 of the first passivation layer 611 in the optical black zone OB of the first substrate 100 may be about 700 Å to about 1,900 Å. The first edge thickness T118 and the thickness T119 of the first passivation layer 611 on the first point 590 of the microlens layer 500 depicted in FIG. 4B may each be equal to or smaller than about 40% of the fifth thickness T131.

As shown in FIG. 4B, the second passivation layer 621 may be disposed on the first curved surface 510*a*, the second curved surface 520*a*, an the first point 590 of the microlens layer 500, thereby protecting the microlens layer 500. A thickness of the second passivation layer 621 may be more uniform than that of the first passivation layer 611. For example, in the central region of the first lens pattern 510, the second passivation layer 621 may have a second thickness T211 of about 100 Å to about 200 Å. The second passivation layer 621 on the first point 590 of the microlens layer 500 may have a thickness T219 that is about 60% to about 100% of the second thickness T211. The thickness T219 of the second passivation layer 621 on the first point 590 of the microlens layer 500 may be about 100 Å to about 200 Å. The second passivation layer 621 may have a second edge thickness T218 in the edge region of the first lens pattern 510. The second edge thickness T218 may be about 60% to about 100% of the second thickness T211. The second edge thickness T218 may be about 100 Å to about 200 Å. Therefore, even when the first passivation layer 611 does not sufficiently cover the first point 590 of the microlens layer 500, the second passivation layer 621 may protect the first point 590 of the microlens layer 500. A sum of the first and second thicknesses T111 and T211 may be about 800 Å to about 2,000 Å.

At the central region of the second lens pattern 520, the second passivation layer 621 may have a thickness T212 that is about 90% to about 110% of the second thickness T211.

Referring to FIG. 4C, a fourth thickness T220 of the second passivation layer 621 in the optical black zone OB of the first substrate 100 may be about 100 Å to about 200 Å. As shown in FIGS. 4B and 4C, the second edge thickness T218 and the thickness T219 of the second passivation layer 621 on the first point 590 of the microlens layer 500 may each be about 60% to about 100% of the fourth thickness T220. A sum of the third and fourth thicknesses T121 and T220 may range from about 800 Å to about 2,000 Å.

As shown in FIG. 4D, a sixth thickness T231 of the second passivation layer 621 in the pad zone PAD of the first substrate 100. The second edge thickness T218 and the thickness T219 of the second passivation layer 621 on the first point 590 of the microlens layer 500 may each be about 60% to about 100% of the sixth thickness T231. A sum of the fifth and sixth thicknesses T131 and T231 may range from about 800 Å to about 2,000 Å.

The second passivation layer 621 may be denser than the first passivation layer 611. That is ,the second passivation layer 621 may have a density greater than that of the first passivation layer 611, but the disclosure is not limited thereto.

Figure 5:
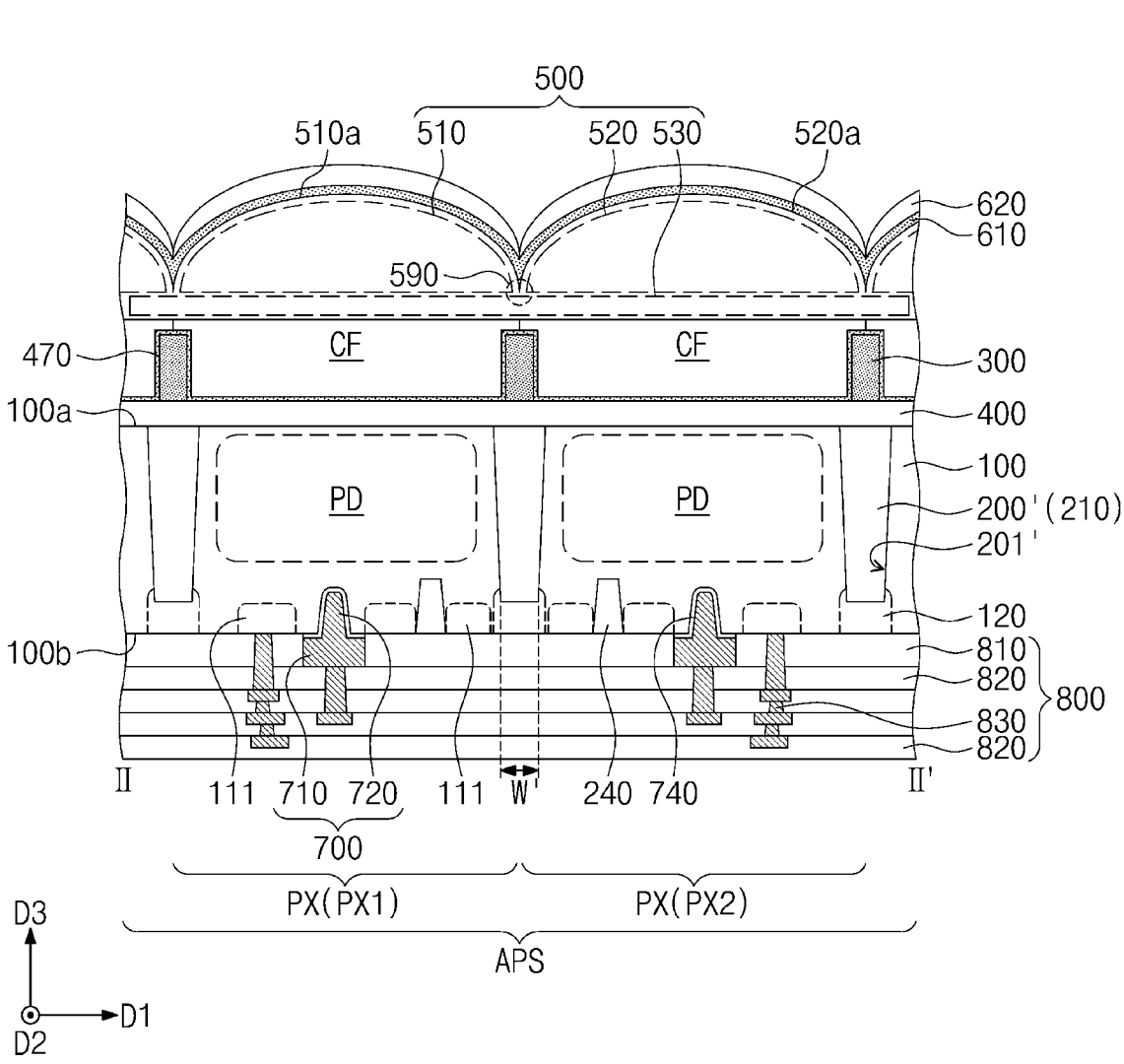
FIG. 5 illustrates a cross-sectional view showing a separation pattern of an image sensor according to an embodiment.

FIG. 5 illustrates an enlarged cross-sectional view of section A of FIG. 2B taken along the line II-II' of FIG. 2C, showing a separation pattern of an image sensor according to embodiments. The following description will also refers to FIGS. 2B and 2C.

Referring to FIG. 5, a separation pattern 200' may be provided in the first substrate 100. The separation pattern 200' may be provided in a first trench 201', and the first trench 201' may penetrate the first surface 100*a* of the first substrate 100. The separation pattern 200' may have a top surface at substantially the same level as that of the first surface 100*a* of the first substrate 100. The first trench 201' may have a bottom surface provided in the first substrate 100. The separation pattern 200' may have a bottom surface spaced apart from the second surface 100*b* of the first substrate 100. Alternatively or additionally, the separation pattern 200' may further penetrate the second surface 100*b* of the first substrate 100. A width W' at the bottom surface of the separation pattern 200' may be smaller than a width at the top surface of the separation pattern 200'. The separation pattern 200' may include a first separation pattern 210, but may not include a second separation pattern 220 discussed in FIG. 2D.

A separation region 120 may further be provided in the first substrate 100. The separation region 120 may be provided between the bottom surface of the separation pattern 200' and the second surface 100*b* of the first substrate 100. The separation region 120 may include a III-group element. For example, the separation region 120 may be an area doped with impurities having the first conductivity type (e.g., p-type). The separation region 120 and the separation pattern 200' may define the pixel sections PX.

Figure 6A:
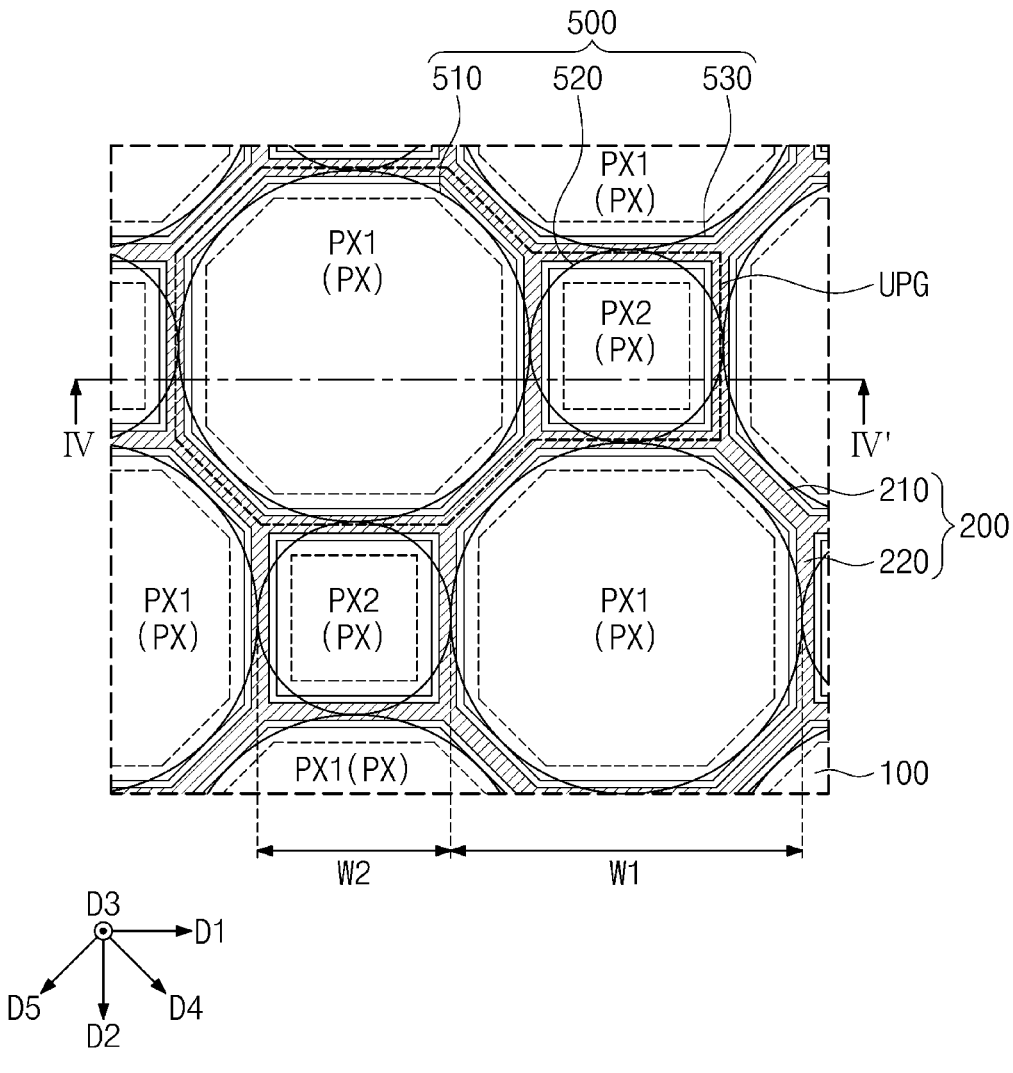
FIG. 6A illustrates a plan view showing a pixel array zone of an image sensor according to embodiments.
Figure 6B:
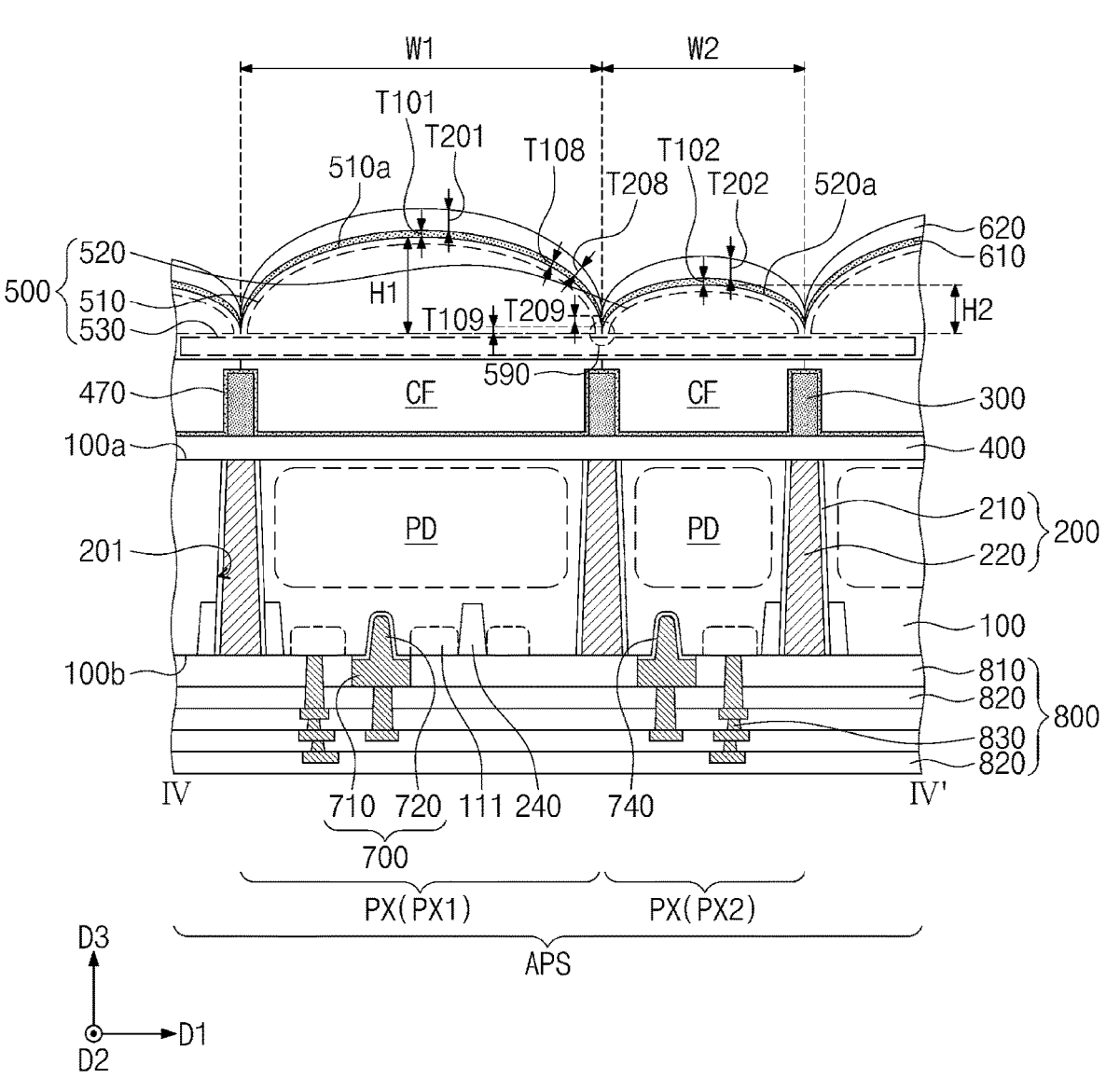
FIG. 6B illustrates a cross-sectional view taken along a line IV-IV' of FIG. 6A.

FIG. 6A illustrates an enlarged plan view of section X depicted in FIG. 2A, showing a pixel array zone of an image sensor according to embodiments. FIG. 6B illustrates a cross-sectional view taken along line IV-IV' of FIG. 6A. The following description will also refer to FIGS. 2A and 2B.

Referring to FIGS. 6A and 6B, the pixel array zone (see APS of FIG. 2A) of the first substrate 100 may include a plurality of unit pixel groups UPG, and each of the unit pixel groups UPG may include a first pixel section PX1 and a second pixel section PX2. According to embodiments, the first pixel section PX1 may serve as a primary pixel, and the second pixel section PX2 may serve as a subsidiary pixel. For example, when the image sensor operates, on each of the unit pixel groups UPG, a photoelectric conversion signal that is output from the second pixel section PX2 may be used to correct a photoelectric conversion signal that is output from the first pixel section PX1. Therefore, the image sensor may increase in optical properties and sensing accuracy. The second pixel section PX2, however, is not limited to the function mentioned above.

The first pixel sections PX1 may be arranged in the first diagonal direction D4. The second pixel sections PX2 may be arranged in a second diagonal direction D5. The second diagonal direction D5 may be parallel to the first surface 100$a$, and may intersect the first direction D1, the second direction D2, and the first diagonal direction D4. For example, the second diagonal direction D5 may be substantially orthogonal to the first diagonal direction D4.

Each of the first pixel sections PX1 may have an octagonal shape. Each of a plurality of second pixel sections PX2 may be surrounded by four neighboring first pixel sections PX1. Each of the second pixel sections PX2 may have a tetragonal shape. The second pixel sections PX2 may have their sizes smaller than those of the first pixel sections PX1. For example, the second pixel sections PX2 may have their widths smaller than those of the first pixel sections PX1. A width of a certain component may be measured in a direction parallel to the first direction D1. According to embodiments, planar shapes and sizes of the first pixel sections PX1 and the second pixel sections PX2 may be adjusted to highly integrate the first and second pixel sections PX1 and PX2. The following will discuss a single first pixel section PX1 and a single second pixel section PX2.

Referring to FIG. 6B, the first lens pattern 510 may be provided on the first pixel section PX1. The first lens pattern 510 may have a first lens width W1 and a first height H1. The first lens width W1 may be a width at a bottom surface of the first lens pattern 510. The bottom surface of the first lens pattern 510 may be an imaginary surface and may be disposed at the same level as that of the first point 590. The first height H1 may be a vertical length between an uppermost portion of the first curved surface 510$a$ of the first lens pattern 510 and the bottom surface of the first lens pattern 510. For example, the first height H1 may be a maximum height of the first lens pattern 510.

The second lens pattern 520 may be provided on the second pixel section PX2. The second lens pattern 520 may have a second lens width W2 and a second height H2. The second lens width W2 may be a width at a bottom surface of the second lens pattern 520. The bottom surface of the second lens pattern 520 may be an imaginary surface and may be disposed at the same level as that of the first point 590. The second lens width W2 may be smaller than the first lens width W1. The second height H2 may be a vertical length between an uppermost portion of the second curved surface 520$a$ of the second lens pattern 520 and the bottom surface of the second lens pattern 520. The second height H2 may be a maximum height of the second lens pattern 520. The second height H2 may be smaller than the first height H1.

The first passivation layer 610 may be disposed on the first curved surface 510$a$, the second curved surface 520$a$, and the first point 590 of the microlens layer 500. The second passivation layer 620 may be disposed on the first passivation layer 610. The first passivation layer 610 and the second passivation layer 620 may be substantially the same as those described in reference to FIGS. 2A to 2H. For example, the first thickness T101, the second thickness T201, the third thickness T120, the fourth thickness T220, the fifth thickness T130, the sixth thickness T230, the first edge thickness T108, the second edge thickness T208, the thickness T109 of the first passivation layer 610 on the first point 590 of the microlens layer 500, and the thickness T209 of the second passivation layer 620 on the first point 590 of the microlens layer 500 may satisfy the conditions described in reference to FIG. 2A to 3H.

An increase in size of the first lens pattern 510 may cause difficulty in providing the first passivation layer 610 on the first point 590 of the microlens layer 500. According to embodiments, as the first passivation layer 610 is provided, the first point 590 of the microlens layer 500 may be sufficiently disposed below the first passivation layer 610.

According to embodiments, the first passivation layer 610 may be substantially the same as the first passivation layer 611 and the second passivation layer 621 shown in FIGS. 4A to 4D. For example, the first thickness T101, the second thickness T201, the third thickness T120, the fourth thickness T220, the fifth thickness T130, the sixth thickness T230, the first edge thickness T108, the second edge thickness T208, the thickness T109 of the first passivation layer 610 on the first point 590 of the microlens layer 500, the thickness T209 of the second passivation layer 620 on the first point 590 of the microlens layer 500 may satisfy the conditions for the first thickness T111, the second thickness T211, the third thickness T121, the fourth thickness T221, the fifth thickness T131, the sixth thickness T231, the first edge thickness T118, the second edge thickness T218, the thickness T119 of the first passivation layer 611 on the first point 590 of the microlens layer 500, and the thickness T219 of the second passivation layer 621 on the first point 590 of the microlens layer 500 that are depicted in FIGS. 4A to 4D.

Figure 7A:
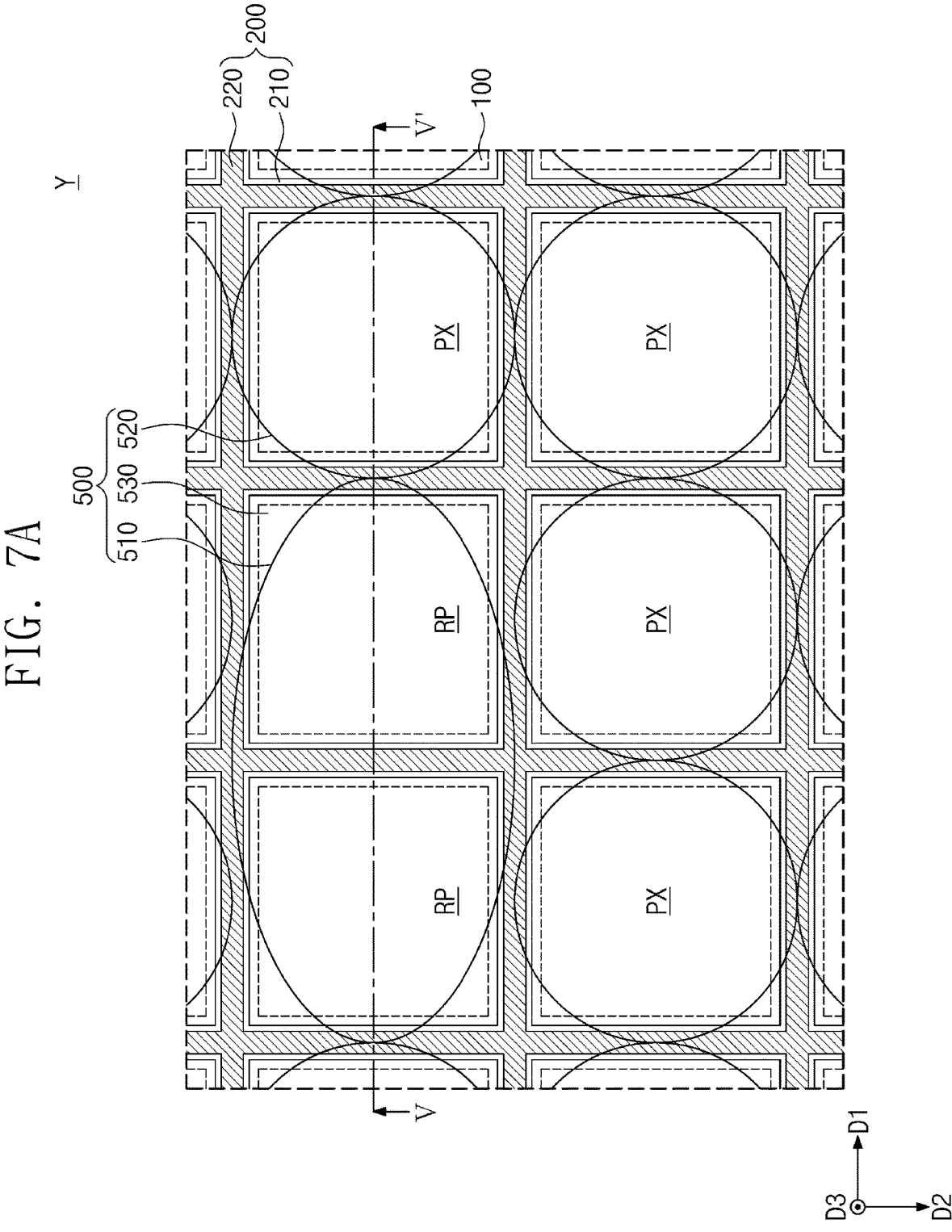
FIG. 7A illustrates an enlarged view showing section Y of FIG. 2A.
Figure 7B:
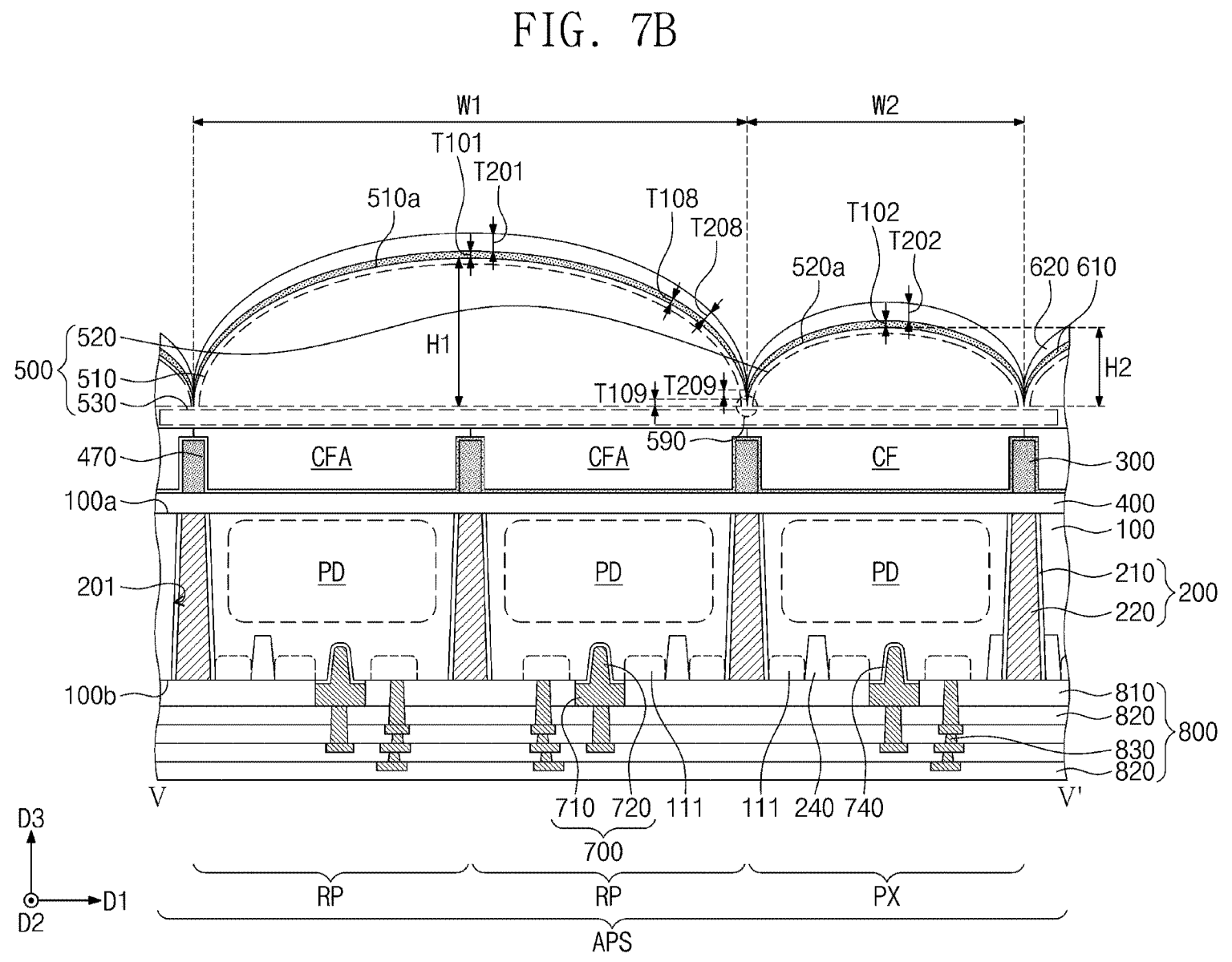

FIG. 7A illustrates an enlarged view of section Y depicted in FIG. 2A, showing a pixel array zone of an image sensor according to embodiments. FIG. 7B illustrates a cross-sectional view taken along the line V-V' of FIG. 7A. The following description will also refer to FIGS. 2A and 2B.

Referring to FIGS. 7A and 7B, the pixel array zone (see APS of FIG. 2A) of the first substrate 100 may include pixel sections PX and focus pixel sections RP. The focus pixel sections RP may be the same as the pixel sections PX in terms of shape, arrangement, and material discussed above. For example, in the first substrate 100, the photoelectric conversion regions PD, the device isolation pattern 240, and the impurity regions 111 may be disposed on corresponding focus pixel sections RP. The focus pixel sections RP may include components of focus detection pixels. The focus detection pixels may serve to correct focuses of images that are output from the pixel sections PX, but not to output captured images of target objects. According to embodiments, the photoelectric conversion regions PD may be disposed laterally spaced apart from each other in a plan view, and light incident on the photoelectric conversion regions PD may have different phases from each other. A phase difference between images obtained in the photoelectric conversion regions PD may be compared to correct a focus of the obtained image. For example, a photoelectric signal that is output from the focus pixel section RP and a photoelectric signal that is output from the pixel section PX may be compared with each other to correct a focus of an image that is output from the pixel section PX. Therefore, the image sensor may obtain three-dimensional depth information about the target objects. No limitation is imposed on the number and arrangement of the focus pixel sections RP included in the pixel array zone APS of the first substrate 100.

The image sensor may further include focus color filters CFA. The focus color filters CFA may be provided in corresponding focus pixel sections RP on the first surface 100a of the first substrate 100. The focus color filters CFA may be disposed on the dielectric layer 400. The focus color filters CFA may be disposed side by side with the color filters CF. Each of the focus color filters CFA may include a white color filter or a transparent filter. Alternatively or additionally, the focus color filters CFA may include one of red, green, and blue filters, similar to the color filters CF.

Referring to FIG. 7B, the first lens pattern 510 may be provided on the focus pixel section RP. The second lens pattern 520 may be provided on the pixel section PX. The first lens width W1 may be greater than the second lens width W2. The first height H1 may be greater than the second height H2.

The first passivation layer 610 may be disposed on the first curved surface 510a, the second curved surface 520a, and the first point 590 of the microlens layer 500. The first passivation layer 610 and the second passivation layer 620 may be substantially the same as those described in reference to FIGS. 2B to 2H. For example, the first passivation layer 610 and the second passivation layer 620 may satisfy the thickness conditions described in reference to FIGS. 2E to 2H.

According to embodiments, the first passivation layer 610 and the second passivation layer 620 may be substantially the same as the first passivation layer 611 and the second passivation layer 621 shown in FIGS. 4A to 4D.

Figure 8:
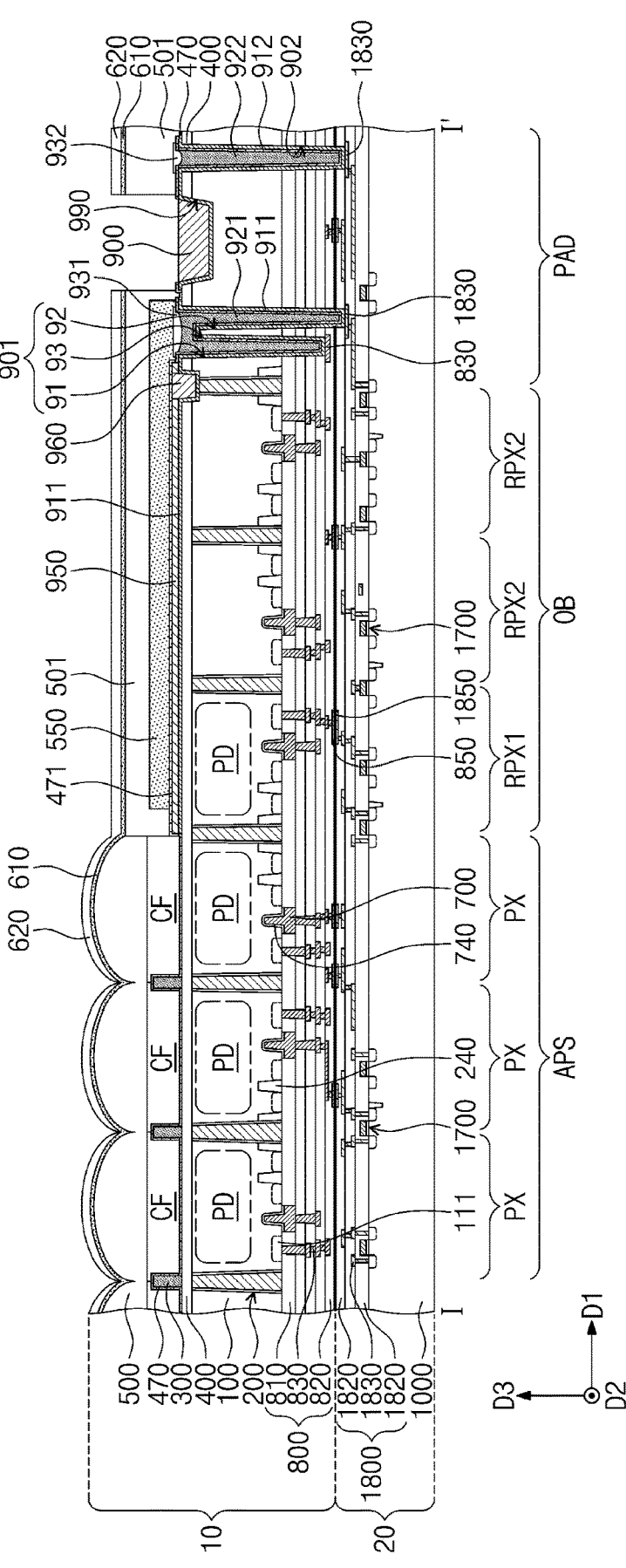
FIG. 8 illustrates a cross-sectional view showing an image sensor according to an embodiments.

FIG. 8 illustrates a cross-sectional view taken along the line I-I' of FIG. 2A, showing an image sensor according to embodiments.

Referring to FIG. 8, an image sensor may include a sensor chip 10 and a circuit chip 20. The sensor chip 10 and the circuit chip 20 may be substantially the same as those discussed above with reference to FIGS. 2A and 2B. For example, the sensor chip 10 may include the first substrate 100, the first wiring layer 800, the separation pattern 200, the fence patterns 300, the dielectric layer 400, the color filters CF, the microlens layer 500, the first passivation layer 610, the second passivation layer 620, the light-shield layer 950, the organic layer 501, the filtering layer 550, the bonding pad 900, the first conductive pattern 911, and the second conductive pattern 912. The circuit chip 20 may include the second substrate 1000 and the second wiring layer 1800.

Unlike the sensor chip shown in FIG. 2B, the sensor chip 10 in the present embodiment may further include a first connection pad 850. The first connection pad 850 may be exposed on a bottom surface of the sensor chip 10. For example, the first connection pad 850 may be disposed in a lowermost second lower dielectric layer 820 of the first wiring layer 800. The first connection pad 850 may be electrically connected to the first conductive structure 830. The first connection pad 850 may include metal, such as copper, aluminum, tungsten, titanium, or any alloy thereof.

In addition, the circuit chip 20 may include a second connection pad 1850. The second connection pad 1850 may be exposed on a top surface of the circuit chip 20. The second connection pad 1850 may be disposed in a lowermost third lower dielectric layer 1820. The second connection pad 1850 may be electrically connected to the integrated circuit 1700. The second connection pad 1850 may include metal, such as copper, aluminum, tungsten, titanium, or any alloy thereof.

The circuit chip 20 and the sensor chip 10 may be connected to each other by direct bonding. For example, the first connection pad 850 and the second connection pad 1850 may be vertically aligned and in contact with each other. Therefore, the second connection pad 1850 may be directly bonded to the first connection pad 850. An electrical signal may be transferred from the integrated circuit 1700 of the circuit chip 20 to the bonding pad 900 or a transistor of the sensor chip 10 through the second conductive structure 1830, the second connection pad 1850, the first connection pad 850, and the first conductive structure 830. The second lower dielectric layer 820 may be directly bonded to the third lower dielectric layer 1820. In this case, a chemical bond may further be formed between the second lower dielectric layer 820 and the third lower dielectric layer 1820.

The first through hole 901 may include a first hole 91, a second hole 92, and a third hole 93. The first hole 91 may penetrate the dielectric layer 400, the first substrate 100, and the first wiring layer 800, and may have a first bottom surface. The first bottom surface may expose a top surface of the first conductive structure 830. The second hole 92 may penetrate the dielectric layer 400, the first substrate 100, and the first wiring layer 800, and may extend into an upper portion of the second wiring layer 1800. The second hole 92 may have a second bottom surface, and the second bottom surface may expose a top surface of the second conductive structure 1830. The second hole 92 may have a sidewall spaced apart from that of the first hole 91. The third hole 93 may be provided between and connected to an upper portion of the first hole 91 and an upper portion of the second hole 92. The first through hole 901 may be provided therein with the first conductive pattern 911, the protective dielectric layer 471, and the first buried pattern 921. The first conductive pattern 911 may be disposed on inner walls of the first, second, and third holes 91, 92, and 93.

According to embodiments, it may be possible to achieve any combination of the example of FIGS. 2A to 2H, the example of FIGS. 3A to 3C, the example of FIGS. 4A to 4D, the example of FIG. 5, the example of FIGS. 6A and 6B, the example of FIGS. 7A and 7B, and the example of FIG. 8.

FIGS. 9A to 9D illustrate cross-sectional views showing a method of manufacturing an image sensor according to embodiments. A duplicate description will be omitted below.

Figure 9A:
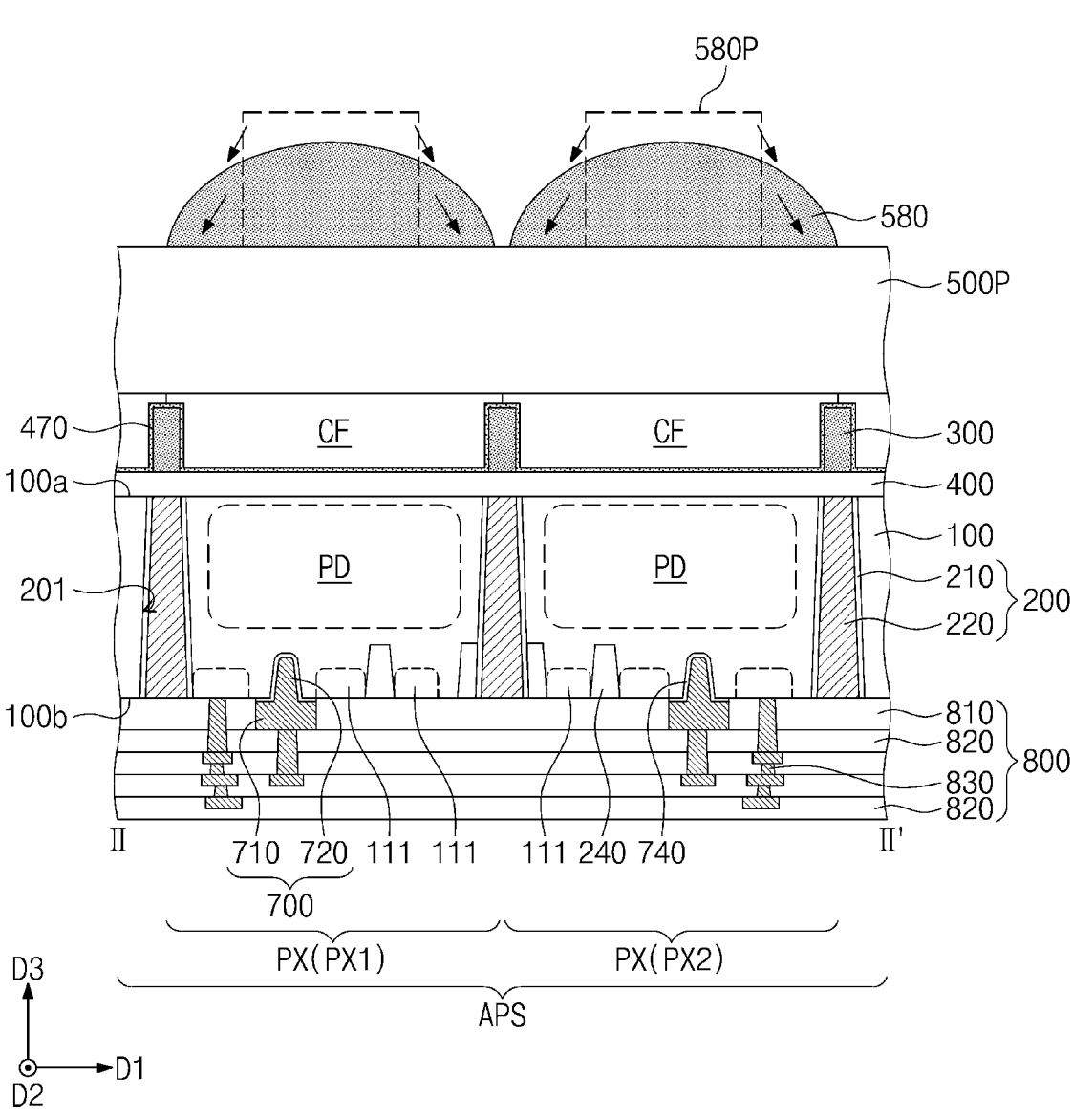
FIGS. 9A to 9D illustrate cross-sectional views showing a method of fabricating an image sensor according to embodiments.

Referring to FIG. 9A, a first substrate 100 may be doped with impurities having the first conductivity type. Photoelectric conversion regions PD may be formed by implanting the first substrate 100 with impurities having the second conductivity type. A device isolation pattern 240 may be formed in the first substrate 100 to be adjacent to a second surface 100b of the first substrate 100. A first trench 201 and a separation pattern 200 may be formed in the first substrate 100. The second surface 100b of the first substrate 100 may be implanted with impurities having the second conductivity type to form impurity regions 111. A gate pattern 700 may be formed on corresponding pixel sections PX. First and second lower dielectric layers 810 and 820 and first conductive structures 830 may be formed on the second surface 100b of the first substrate 100, thereby forming a wiring layer 800.

A first surface 100a of the first substrate 100 may undergo a grinding process to thin the first substrate 100. A dielectric layer 400, fence patterns 300, a protective pattern 470, and a plurality of color filters CF may be formed on the first surface 100a of the thinned first substrate 100.

A preliminary lens layer 500P may be formed on top surfaces of the color filters CF. A spin coating process may be used to form the preliminary lens layer 500P.

Sacrificial patterns 580 may be formed on the preliminary lens layer 500P. The sacrificial patterns 580 may be formed on positions that correspond to positions of the respective pixel sections PX included in the first substrate 100. The sacrificial patterns 580 may be disposed laterally spaced apart from each other. The formation of the sacrificial patterns 580 may include forming a sacrificial layer on the preliminary lens layer 500P, patterning the sacrificial layer to form preliminary sacrificial patterns 580P, and allowing the preliminary sacrificial patterns 580P to undergo a reflow process. During the reflow process, as indicated by arrows, the preliminary sacrificial patterns 580P may downwardly flow toward a top surface of the preliminary lens layer 500P. Therefore, the sacrificial patterns 580 may be formed. Each of the sacrificial patterns 580 may have a hemispheric shape. The sacrificial patterns 580 may include an organic material. For example, the sacrificial patterns 580 may include a polymer, such as photoresist.

Figure 9B:
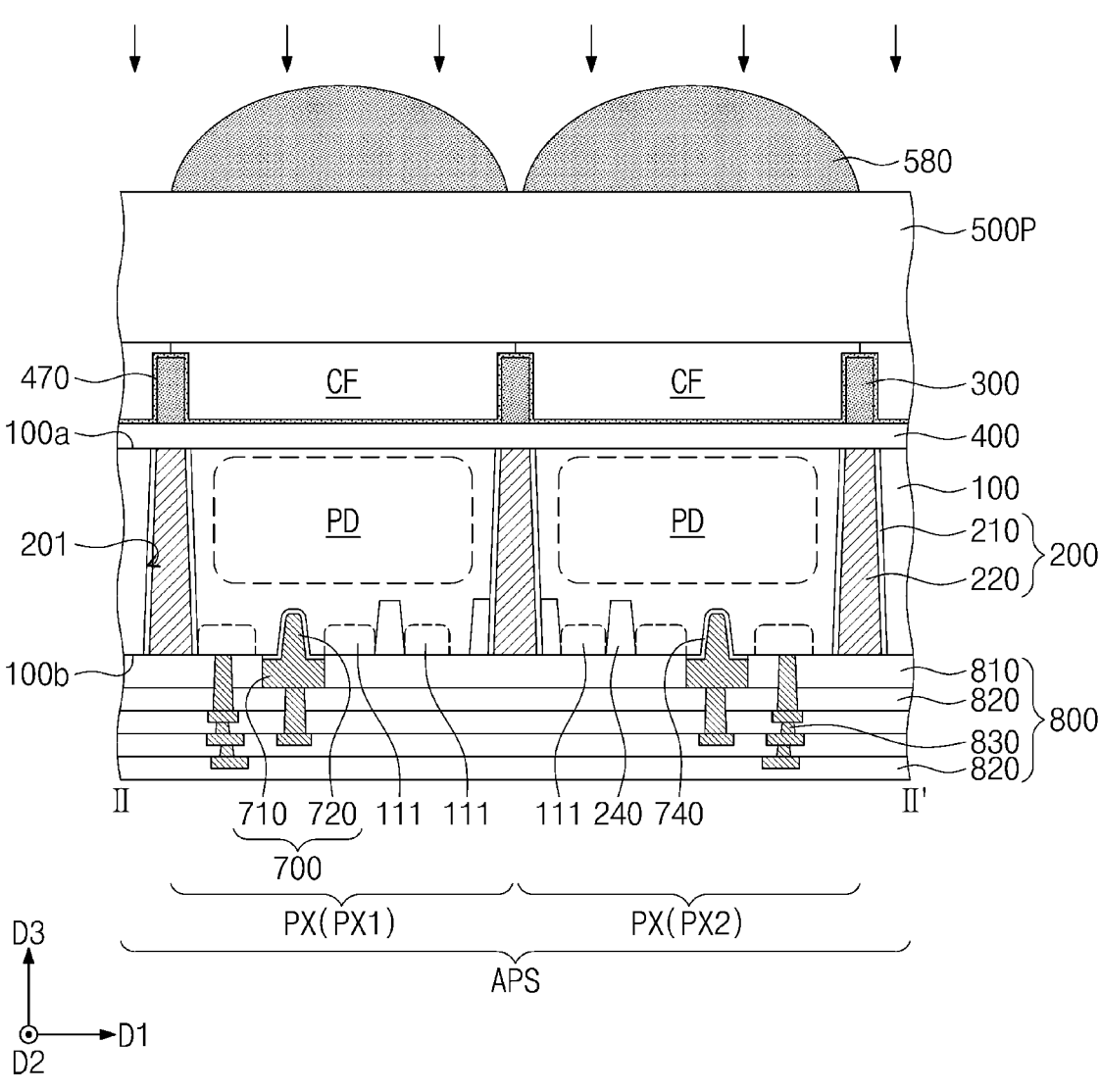
Figure 9C:
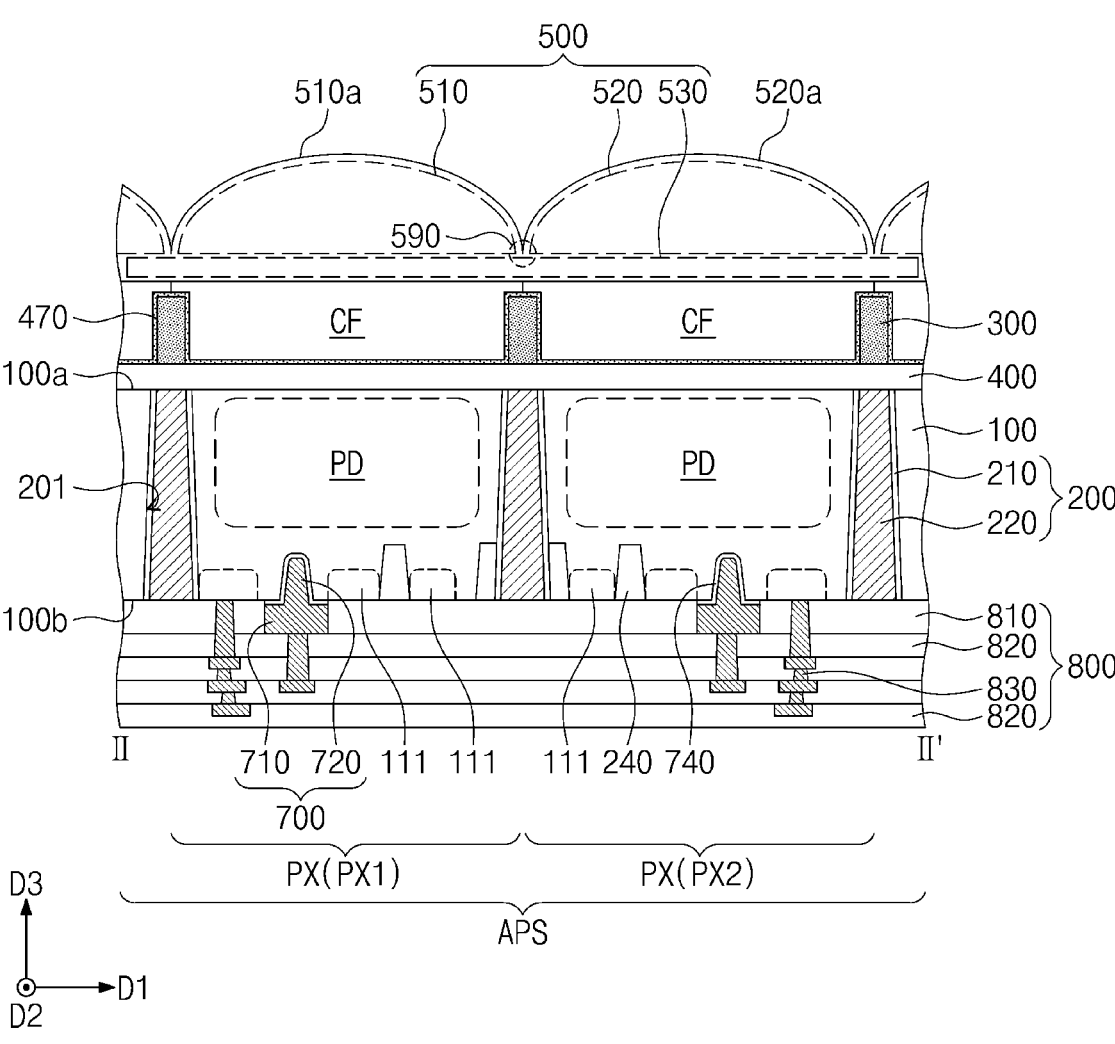

Referring to FIGS. 9B and 9C, an etch-back process may be performed on the sacrificial patterns 580 to form a microlens layer 500. The etch-back process may cause shapes of the sacrificial patterns 580 to be transferred onto the preliminary lens layer 500P to form a first lens pattern 510 and a second lens pattern 520. A planarized part 530 may be provided on a bottom surface of the first lens pattern 510 and a bottom surface of the second lens pattern 520. A first point 590 may be defined between the first and second lens patterns 510 and 520.

Figure 9D:
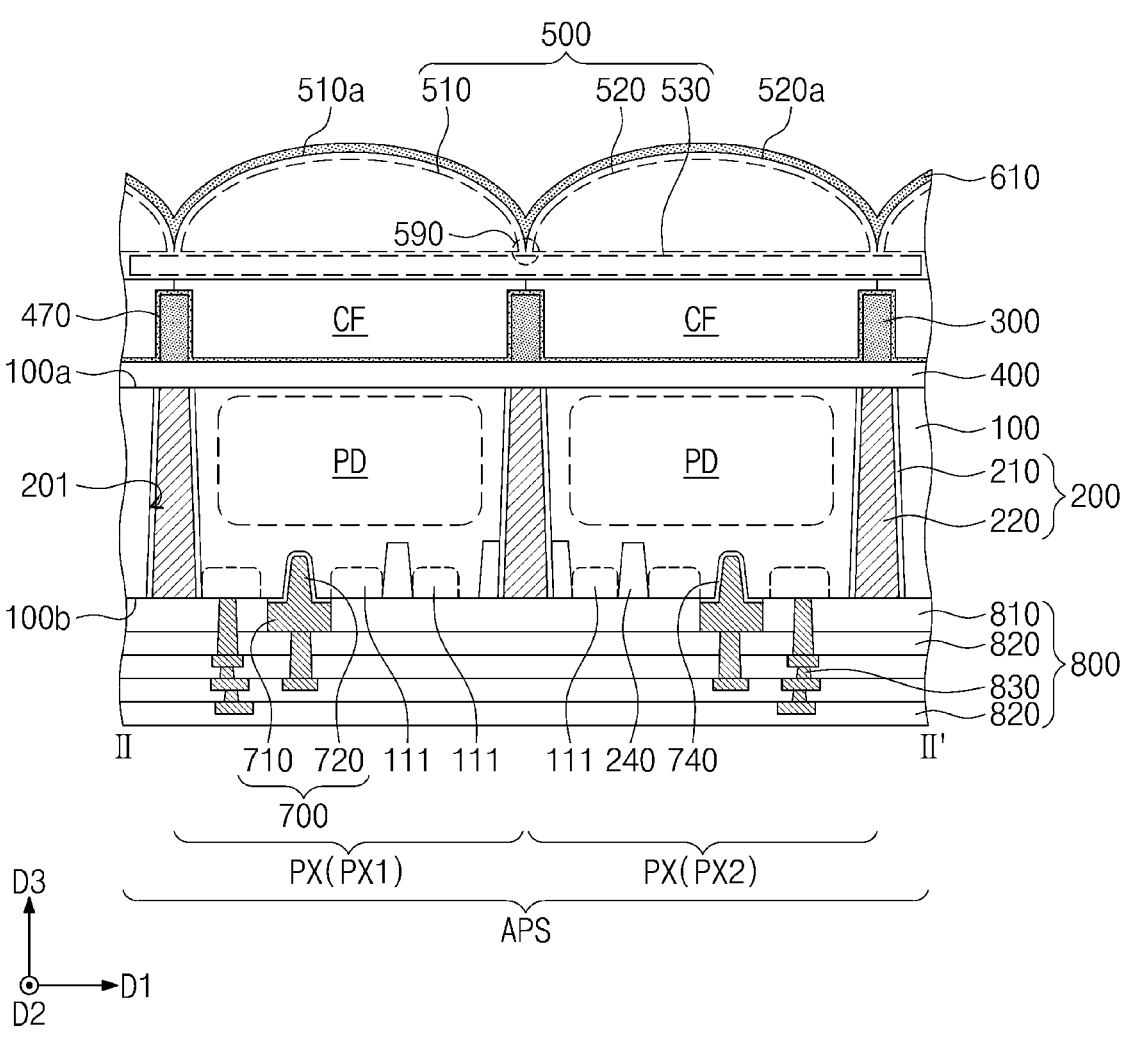

Referring to FIG. 9D, a first passivation layer 610 may be formed on the microlens layer 500 to be disposed on the first lens pattern 510, the second lens pattern 520, and the first point 590. For example, an atomic layer deposition (ALD) process may be performed to form the first passivation layer 610. Therefore, the first passivation layer 610 may have a relatively uniform thickness. The thickness of the first passivation layer 610 may satisfy the conditions described in reference to FIGS. 2A to 2H. According to an embodiment, the first passivation layer 610 may be formed by a coating process or a dipping process.

Referring back to FIG. 2D, a second passivation layer 620 may be formed on the first passivation layer 610. The second passivation layer 620 may be formed by one of a method and a process condition that are different from those used for forming the first passivation layer 610. For example, the second passivation layer 620 may be formed by a deposition process, such as chemical vapor deposition (CVD).

After the second passivation layer 620 is formed, a bonding pad 900 of FIG. 2B may be formed. For example, when the first passivation layer 610 is satisfactorily disposed on the first point 590, the first lens pattern 510, and the second lens pattern 520 of the microlens layer 500, the microlens layer 500 may not be exposed to an etching process used for the formation of the bonding pad 900. Therefore, the microlens layer 500 may be prevented from being damaged. The processes discussed above may fabricate an image sensor. As the second passivation layer 620 is provided, the microlens layer 500 may be favorably protected in a packaging process of the image sensor.

Figure 9E:
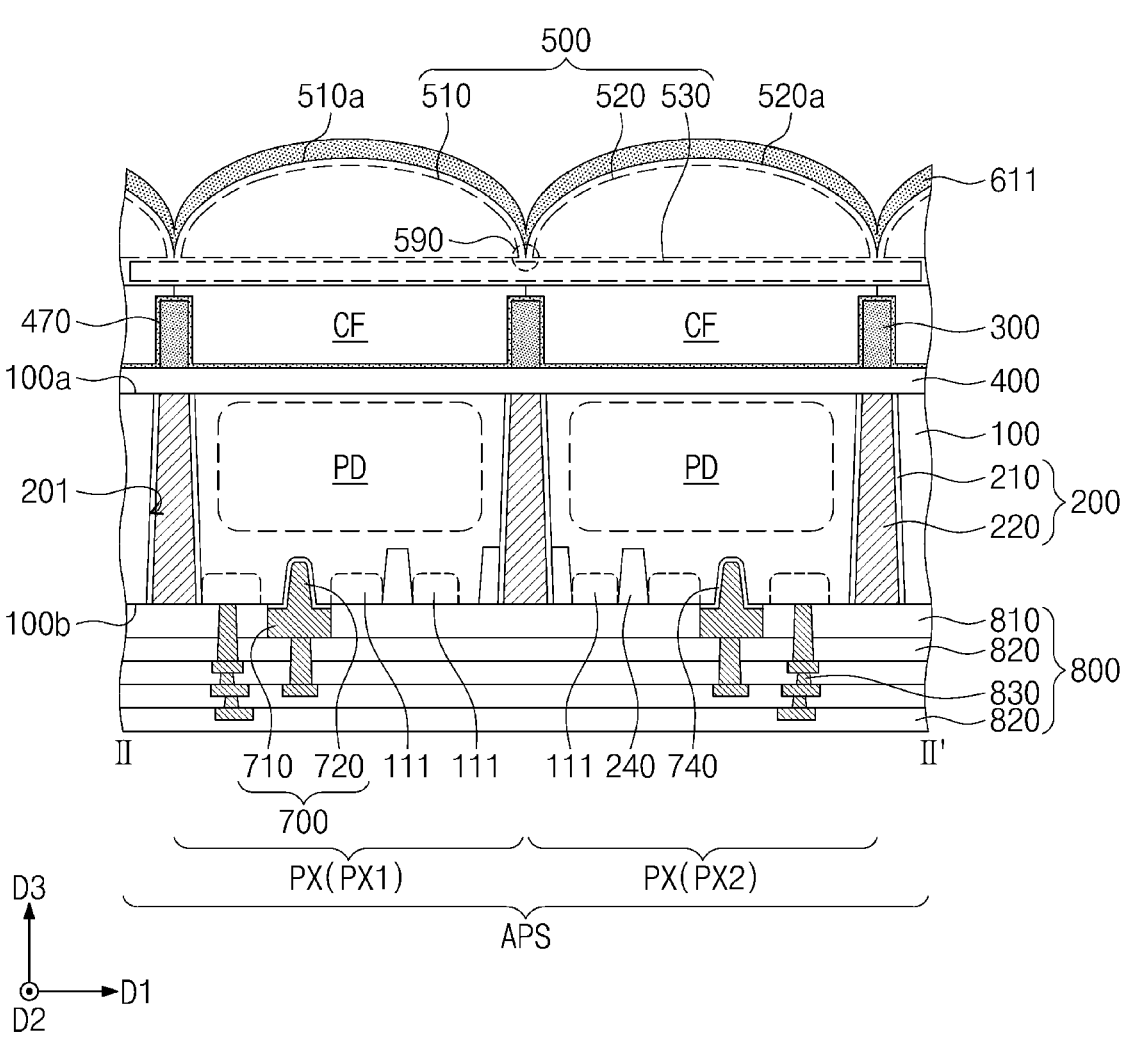
FIG. 9E illustrates a method of forming a first passivation layer according to embodiments.

FIG. 9E illustrates a method of forming a first passivation layer according to embodiments.

Referring to FIG. 9E, a first substrate 100 may be provided. The method discussed in FIG. 9A may be performed to form photoelectric conversion regions PD, impurity regions 111, a device isolation pattern 240, a first trench 201, a separation pattern 200, a gate pattern 700, a wiring layer 800, a dielectric layer 400, fence patterns 300, a protective pattern 470, and color filters CF. A microlens layer 500 may be formed by the method discussed in the example of FIGS. 9A to 9C.

A first passivation layer 611 may be formed on the microlens layer 500. For example, the first passivation layer 611 may be formed by a deposition process, such as chemical vapor deposition (CVD). The first passivation layer 611 may be disposed on a top surface at the central region of the first lens pattern 510 and a top surface at the central region of the second lens pattern 520. The first passivation layer 611 may be substantially the same as the first passivation layer 611 of FIGS. 4A to 4D.

Referring back to FIGS. 4A to 4D, a second passivation layer 621 may be formed on the first passivation layer 611. An atomic layer deposition process may be used to form the second passivation layer 621. The second passivation layer 621 may have a relatively uniform thickness. The thickness of the second passivation layer 621 may satisfy the conditions discussed in the example of FIGS. 4A to 4D. Alternatively, the second passivation layer 621 may be formed by a coating process or a dipping process. The second passivation layer 621 may be formed by one of a method and a process condition that are different from those used for forming the first passivation layer 611. The processes discussed above may fabricate an image sensor discussed in FIGS. 4A to 4D.

The second passivation layer 621 may be disposed above the first point 590, the first lens pattern 510, and the second lens pattern 520 of the microlens layer 500. Therefore, the microlens layer 500 may not be exposed to an etching process used for the formation of the bonding pad 900. As the first passivation layer 611 is provided, a sum of the first thickness T111 and the second thickness T211 may range from about 800 Å to about 2,000 Å. Accordingly, the microlens layer 500 may be prevented from being damaged, and the image sensor may improve in optical properties.

According to the disclosure, one or more passivation layers may have certain thicknesses to be satisfactorily disposed on a microlens layer. The passivation layer may not expose the microlens layer. Thus, the microlens layer may be prevented from being damaged.

This above descriptions of the embodiments should not be construed to limit the disclosure, and instead to cover various modifications and variations of the embodiments without departing from the spirit and scope of the disclosure.

What is claimed is:

1. An image sensor comprising:
a substrate comprising a pixel array zone;
a microlens layer on the substrate in the pixel array zone;
a first passivation layer on the microlens layer; and
a second passivation layer on the first passivation layer,
wherein the microlens layer comprises:
a first lens pattern comprising a first curved surface;
a second lens pattern at a side of the first lens pattern and comprising a second curved surface; and
a first point where the first curved surface of the first lens pattern meets the second curved surface of the second lens pattern,
wherein the first passivation layer and the second passivation layer are directly above the first lens pattern and the second lens pattern, and cover and extend over the first point between the first lens pattern and the second lens pattern, and
wherein a thickness of the first passivation layer where the first passivation layer covers the first point is smaller than a thickness of the first passivation layer in a central region of the first lens pattern.

2. The image sensor of claim 1, wherein the first passivation layer is on the first lens pattern, the second lens pattern, and the first point, wherein the second passivation layer covers the first point, and wherein a thickness of the second passivation layer where the second passivation layer covers the first point is smaller than a thickness of the second passivation layer in the central region of the first lens pattern.

3. The image sensor of claim 2, wherein a density of the first passivation layer is greater than a density of the second passivation layer.

4. The image sensor of claim 1, wherein the second passivation layer is not on the first point.

5. The image sensor of claim 1, wherein the second passivation layer is on the first lens pattern, the second lens pattern, and the first point.

6. The image sensor of claim 5, wherein a density of the second passivation layer is greater than a density of the first passivation layer.

7. The image sensor of claim 1, wherein a first lens width of the first lens pattern is greater than a second lens width of the second lens pattern, and wherein a first height of the first lens pattern is greater than a second height of the second lens pattern.

8. The image sensor of claim 1, further comprising a light-shield layer on the substrate and spaced apart from the microlens layer, wherein the first passivation layer and the second passivation layer extend into a top surface of the light-shield layer.

9. An image sensor comprising:

a substrate comprising a plurality of pixel sections;

a plurality of photoelectric conversion regions in corresponding pixel sections of the substrate;

a microlens layer on a first surface of the substrate and vertically overlapping the plurality of photoelectric conversion regions;

a first passivation layer on the microlens layer; and a second passivation layer on the first passivation layer, wherein the microlens layer comprises:

a first lens pattern comprising a first curved surface;

a second lens pattern at a side of the first lens pattern and comprising a second curved surface; and a first point where the first curved surface of the first lens pattern meets the second curved surface of the second lens pattern, wherein the first passivation layer and the second passivation layer are directly above the first lens pattern and the second lens pattern, and cover and extend over the first point between the first lens pattern and the second lens pattern, and wherein a thickness of the first passivation layer where the first passivation layer covers the first point is smaller than a thickness of the first passivation layer in a central region of the first lens pattern.

10. The image sensor of claim 9, wherein the thickness of the first passivation layer where the first passivation layer covers the first point is about 60% to about 100% of the thickness of the first passivation layer in the central region of the first lens pattern, wherein the second passivation layer covers the first point, and wherein a thickness of the second passivation layer where the second passivation layer covers the first point is equal to or smaller than about 40% of a thickness of the second passivation layer on the central region of the first lens pattern.

11. The image sensor of claim 9, wherein the thickness of the first passivation layer where the first passivation layer covers the the first point is equal to or smaller than about 40% of the thickness of the first passivation layer in the central region of the first lens pattern, wherein the second passivation layer covers the first point, and wherein a thickness of the second passivation layer where the second passivation layer covers the first point is about 60% to about 100% of a thickness of the second passivation layer in the central region of the first lens pattern.

12. The image sensor of claim 11, wherein the second passivation layer is on the first point.

13. The image sensor of claim 9, further comprising:

a bonding pad on the first surface of the substrate at an edge section; and a through conductive pattern, at a side of the bonding pad, that penetrates substrate at the edge section, wherein the through conductive pattern is electrically connected to the bonding pad, wherein the first passivation layer and the second passivation layer vertically overlap the through conductive pattern, and wherein the first passivation layer and the second passivation layer are spaced apart from the bonding pad.

14. An image sensor comprising:

a substrate comprising a pixel array zone;

a plurality of photoelectric conversion regions in the pixel array zone;

a plurality of separation patterns between the photoelectric conversion regions in the substrate;

a dielectric layer on a first surface of the substrate;

a plurality of color filters on the dielectric layer in the pixel array zone;

a fence pattern between the color filters;

a microlens layer on the color filters;

a gate pattern on a second surface of the substrate in the pixel array zone;

a wiring layer on the second surface of the substrate in the pixel array zone;

a first passivation layer on the microlens layer in the pixel array zone; and a second passivation layer on the first passivation layer, wherein the microlens layer comprises:

a first lens pattern comprising a first curved surface;

a second lens pattern at a side of the first lens pattern and comprising a second curved surface; and a first point where the first curved surface of the first lens pattern meets the second curved surface of the second lens pattern, wherein the first passivation layer and the second passivation layer are directly above the first lens pattern and the second lens pattern, and cover and extend over the first point between the first lens pattern and the second lens pattern, and wherein a thickness of the first passivation layer where the first passivation layer covers the first point is smaller than a thickness of the first passivation layer in a central region of the first lens pattern.

15. The image sensor of claim 14, wherein the second passivation layer is not on the first point, and wherein a density of the first passivation layer is greater than a density of the second passivation layer.

16. The image sensor of claim 14, wherein the substrate further comprises a pad zone and an optical black zone between the pixel array zone and the pad zone, wherein the dielectric layer overlaps the pixel array zone, the optical black zone, and the pad zone, wherein the image sensor further comprises:

a light-shield layer on the dielectric layer in the optical black zone;

an organic layer on the light-shield layer in the optical black zone and the pad zone;

a bonding pad on the first surface of the substrate in the pad zone; and a through conductive pattern, at a side of the bonding pad, that penetrates the pad zone, wherein the first passivation layer and the second passivation layer extend into the optical black zone and the pad zone, and wherein the first passivation layer is on the organic layer.

17. The image sensor of claim 16, wherein the first passivation layer and the second passivation layer vertically overlap the through conductive pattern, and are spaced apart from the bonding pad.

\* \* \* \* \*